US011703284B2

(12) United States Patent
Ito et al.

(10) Patent No.: US 11,703,284 B2
(45) Date of Patent: Jul. 18, 2023

(54) TEMPERATURE CONTROL SYSTEM AND INTEGRATED TEMPERATURE CONTROL SYSTEM

(71) Applicants: CKD CORPORATION, Aichi (JP); EBARA CORPORATION, Tokyo (JP); EBARA REFRIGERATION EQUIPMENT & SYSTEMS CO., LTD., Tokyo (JP)

(72) Inventors: Akihiro Ito, Aichi (JP); Norio Kokubo, Aichi (JP); Masayuki Kouketsu, Aichi (JP); Isahiro Hasegawa, Aichi (JP); Toshiharu Nakazawa, Tokyo (JP); Keisuke Takanashi, Tokyo (JP); Yukihiro Fukusumi, Tokyo (JP)

(73) Assignees: CKD CORPORATION, Aichi (JP); EBARA CORPORATION, Tokyo (JP); EBARA REFRIGERATION EQUIPMENT & SYSTEMS CO., LTD., Tokyo (JP)

(*) Notice: Subject to any disclaimer, the term of this patent is extended or adjusted under 35 U.S.C. 154(b) by 261 days.

(21) Appl. No.: 17/092,891

(22) Filed: Nov. 9, 2020

(65) Prior Publication Data
US 2021/0140719 A1 May 13, 2021

(30) Foreign Application Priority Data

Nov. 8, 2019 (JP) ................. 2019-203218

(51) Int. Cl.
*F28F 27/02* (2006.01)
*F28D 20/00* (2006.01)
(Continued)

(52) U.S. Cl.
CPC ....... *F28D 20/0039* (2013.01); *F28D 20/028* (2013.01); *F28F 27/02* (2013.01);
(Continued)

(58) Field of Classification Search
CPC ............ F28D 20/028; F28D 2021/0077; F28F 27/02; H01L 21/67109; H01L 21/67248
See application file for complete search history.

(56) References Cited

U.S. PATENT DOCUMENTS

| 4,271,679 A | 6/1981 | Schafer |
| 5,335,508 A | 8/1994 | Tippmann |
| (Continued) | | |

FOREIGN PATENT DOCUMENTS

| CN | 106196474 A | 12/2016 |
| JP | H09-298192 A | 11/1997 |
| (Continued) | | |

OTHER PUBLICATIONS

Office Action issued in related U.S. Appl. No. 17/100,191 dated Sep. 30, 2022 (14 pages).
(Continued)

*Primary Examiner* — Eric S Ruppert
(74) *Attorney, Agent, or Firm* — Osha Bergman Watanabe & Burton LLP

(57) ABSTRACT

A temperature control system is used for controlling a temperature of a control target. The system includes: a first circulation circuit through which a first heat transfer medium circulates; a second circulation circuit that is independent of the first circulation circuit and through which a second heat transfer medium circulates; and a third circulation circuit that is independent of the first circulation circuit and the second circulation circuit and through which a third heat transfer medium circulates. The third heat transfer medium has a usable temperature range wider than usable temperature ranges of the first heat transfer medium and the second heat transfer medium.

16 Claims, 8 Drawing Sheets

(51) Int. Cl.
  *F28D 20/02* (2006.01)
  *F28D 21/00* (2006.01)
  *H01L 21/67* (2006.01)

(52) U.S. Cl.
  CPC ............... *F28D 2020/0069* (2013.01); *F28D 2020/0078* (2013.01); *F28D 2021/0077* (2013.01); *H01L 21/67109* (2013.01)

(56) References Cited

U.S. PATENT DOCUMENTS

| | | | |
|---|---|---|---|
| 6,063,710 | A | 5/2000 | Kadomura et al. |
| 6,148,626 | A | 11/2000 | Iwamoto |
| 6,174,408 | B1 | 1/2001 | Kadomura et al. |
| 7,988,062 | B2 | 8/2011 | Nonaka et al. |
| 10,580,577 | B2 | 3/2020 | Akiyoshi |
| 2005/0252222 | A1 | 11/2005 | Jessen et al. |
| 2009/0118872 | A1 | 5/2009 | Nonaka et al. |
| 2010/0206519 | A1 | 8/2010 | Cho et al. |
| 2014/0262030 | A1* | 9/2014 | Buchberger, Jr. ............. H01J 37/32724 118/723 R |
| 2018/0156474 | A1 | 6/2018 | Goransson |
| 2018/0374639 | A1 | 12/2018 | Akiyoshi |
| 2020/0132344 | A1 | 4/2020 | Seki |
| 2021/0140719 | A1 | 5/2021 | Ito et al. |
| 2021/0310688 | A1 | 10/2021 | Kato et al. |

FOREIGN PATENT DOCUMENTS

| | | | |
|---|---|---|---|
| JP | 2716248 | B2 | 2/1998 |
| JP | H11183005 | A | 7/1999 |
| JP | 2000339038 | A | 12/2000 |
| JP | 2001134324 | A | 5/2001 |
| JP | 2011-179757 | A | 9/2011 |
| JP | 4956672 | B2 | 6/2012 |
| JP | 5032269 | B2 | 9/2012 |
| JP | 2013-20509 | A | 1/2013 |
| JP | 2013-162097 | A | 8/2013 |
| JP | 5445766 | B2 | 3/2014 |
| JP | 2015183993 | A | 10/2015 |
| JP | 2018-009746 | A | 1/2018 |
| JP | 2019009359 | A | 1/2019 |
| WO | WO-2007073091 | A1 * | 6/2007 ............. C23C 16/46 |
| WO | 2012/066763 | A1 | 5/2012 |
| WO | 2019/021968 | A1 | 1/2019 |

OTHER PUBLICATIONS

Office Action issued in related U.S. Appl. No. 17/093,002 dated Nov. 14, 2022 (17 pages).
Office Action issued in related Taiwanese Patent Application No. 109137322 dated Nov. 3, 2022 (14 pages).
Office Action issued in related U.S. Appl. No. 17/100,227 dated Mar. 9, 2023 (8 pages).
Office Action issued in related Japanese Patent Application No. 2019-209955 dated Mar. 28, 2023 (9 pages).
Office Action issued in corresponding Japanese Patent Application No. 2019-203218 dated Apr. 25, 2023 (5 pages).

* cited by examiner

TEMPERATURE CONTROL SYSTEM AND INTEGRATED TEMPERATURE CONTROL SYSTEM

CROSS REFERENCE TO RELATED APPLICATION

The present application is based on Japanese Patent Application No. 2019-203218 filed on Nov. 8, 2019, and the entire content of which is incorporated herein by reference.

BACKGROUND

Technical Field

The present disclosure relates to a temperature control system for controlling the temperature of a control target.

Description of the Related Art

A conventional temperature adjustment system includes a heat exchanger for performing heat exchange between the heat exchanger and a temperature control target; a cooling side circulation circuit including a cooling means and a heat exchange fluid storage tank; a heating side circulation circuit including a heating means and a heat exchange fluid storage tank; and a switching valve for selectively connecting the cooling side circulation circuit and the heating side circulation circuit to the heat exchanger through switching, whereby a heat exchange fluid is circularly supplied to the heat exchanger (see Japanese Patent Application Laid-Open (kokai) No. 2001-134324).

In the temperature adjustment system (temperature control system) disclosed in Japanese Patent Application Laid-Open No. 2001-134324, a common heat exchange fluid (heat transfer medium) is circulated through the heat exchanger, the cooling side circulation circuit, and the heating side circulation circuit. Therefore, the amount of the heat exchange fluid supplied to the heat exchanger for circulation becomes excessively large, and the temperature of the heat exchange fluid cannot be changed quickly. Accordingly, the disclosed temperature adjustment system has room for improvement, in terms of enhancing responsiveness in controlling the temperature of a temperature control target (control target). Also, since a heat exchange fluid which can be used in a wide temperature range from low temperature to high temperature may be rather expensive, there has been a demand to reduce the amount of such an expensive heat exchange fluid to be used.

SUMMARY

One or more embodiments of the present invention provide a temperature control system which can reduce the amount of an expensive heat transfer medium to be used, and can enhance responsiveness in controlling the temperature of a control target.

One or more embodiments provide a temperature control system for controlling the temperature of a control target. The temperature control system includes a first circulation circuit through which a first heat transfer medium circulates, a second circulation circuit which is independent of the first circulation circuit and through which a second heat transfer medium circulates, and a third circulation circuit which is independent of the first circulation circuit and the second circulation circuit and through which a third heat transfer medium whose usable temperature range is wider than usable temperature ranges of the first heat transfer medium and the second heat transfer medium circulates.

The first circulation circuit includes a first adjustment apparatus which adjusts the temperature of the first heat transfer medium to a first temperature and discharges the temperature-adjusted first heat transfer medium, a first flow-through section (i.e., first flow-through path) through which the first heat transfer medium flows, a first supply path through which the first heat transfer medium supplied from the first adjustment apparatus flows to the first flow-through section, and a first return path through which the first heat transfer medium having flowed through the first flow-through section flows to the first adjustment apparatus.

The second circulation circuit includes a second adjustment apparatus which adjusts the temperature of the second heat transfer medium to a second temperature higher than the first temperature and discharges the temperature-adjusted second heat transfer medium, a second flow-through section (i.e., second flow-through path) through which the second heat transfer medium flows, a second supply path through which the second heat transfer medium supplied from the second adjustment apparatus flows to the second flow-through section, and a second return path through which the second heat transfer medium having flowed through the second flow-through section flows to the second adjustment apparatus.

The third circulation circuit includes a third flow-through section (i.e., third flow-through path) through which the third heat transfer medium flows and which exchanges heat with the first flow-through section, a fourth flow-through section (i.e., fourth flow-through path) through which the third heat transfer medium flows and which exchanges heat with the second flow-through section, a third supply path through which the third heat transfer medium flows from the third flow-through section and the fourth flow-through section to a heat exchange section (i.e., heat exchanger) which exchanges heat with the control target, and a third return path through which the third heat transfer medium flows from the heat exchange section to the third flow-through section and the fourth flow-through section. The third circulation circuit includes no tank for storing the third heat transfer medium.

The temperature control system includes an adjustment section which adjusts the amount of heat exchanged between the first flow-through section and the third flow-through section and the amount of heat exchanged between the second flow-through section and the fourth flow-through section.

According to the above-described configuration, the temperature control system controls the temperature of the control target. The temperature control system includes the first circulation circuit through which the first heat transfer medium circulates, the second circulation circuit which is independent of the first circulation circuit and through which the second heat transfer medium circulates, and the third circulation circuit. The third circulation circuit is independent of the first circulation circuit and the second circulation circuit, and the third heat transfer medium whose usable temperature range is wider than the usable temperature ranges of the first heat transfer medium and the second heat transfer medium circulates through the third circulation circuit. Therefore, the amount of the third heat transfer medium, which may be expensive, to be used can be reduced by causing the third heat transfer medium to circulate only through the third circulation circuit. In addition, the third circulation circuit does not include a tank for storing the third heat transfer medium. Therefore, the amount of the third heat transfer medium circulating through the third circulation circuit can be reduced further. Notably, the first heat transfer medium and the second heat transfer medium may be of the same type.

The first circulation circuit includes the first adjustment apparatus. The first adjustment apparatus adjusts the temperature of the first heat transfer medium to the first temperature and discharges the temperature-adjusted first heat transfer medium. Therefore, the first heat transfer medium adjusted to the first temperature to be used for heat exchange can be supplied. Since the first heat transfer medium whose usable temperature range is narrower than the usable temperature range of the third heat transfer medium is used, an inexpensive heat transfer medium can be used as the first heat transfer medium.

The first circulation circuit includes the first flow-through section through which the first heat transfer medium flows, the first supply path through which the first heat transfer medium supplied from the first adjustment apparatus flows to the first flow-through section, and the first return path through which the first heat transfer medium having flowed through the first flow-through section flows to the first adjustment apparatus. Therefore, thermal energy can be supplied to the first flow-through section via the first heat transfer medium. Also, in the second circulation circuit, the second adjustment apparatus adjusts the temperature of the second heat transfer medium to the second temperature higher than the first temperature. Therefore, the second circulation circuit can achieve the same action and effect as those of the first circulation circuit, by its configuration similar to that of the first circulation circuit.

The third circulation circuit includes the third flow-through section through which the third heat transfer medium flows and which exchanges heat with the first flow-through section, and the fourth flow-through section through which the third heat transfer medium flows and which exchanges heat with the second flow-through section. Therefore, the thermal energy supplied to the first flow-through section can be supplied to the third flow-through section through heat exchange between the first flow-through section and the third flow-through section. Similarly, the thermal energy supplied to the second flow-through section can be supplied to the fourth flow-through section through heat exchange between the second flow-through section and the fourth flow-through section.

The third circulation circuit includes the third supply path through which the third heat transfer medium flows from the third flow-through section and the fourth flow-through section to the heat exchange section which exchanges heat with the control target, and the third return path through which the third heat transfer medium flows from the heat exchange section to the third flow-through section and the fourth flow-through section. Therefore, via the third heat transfer medium, thermal energy can be supplied to the heat exchange section which exchanges heat with the control target. The temperature control system includes the adjustment section which adjusts the amount of heat exchanged between the first flow-through section and the third flow-through section and the amount of heat exchanged between the second flow-through section and the fourth flow-through section. Therefore, the thermal energy supplied to the third flow-through section and the fourth flow-through section can be adjusted by the adjustment section, whereby the thermal energy supplied to the heat exchange section via the third heat transfer medium can be adjusted; as a result, the temperature of the control target can be controlled. As described above, the amount of the third heat transfer medium circulating through the third circulation circuit can be reduced. Accordingly, the temperature of the third heat transfer medium can be changed quickly, whereby responsiveness in controlling the temperature of the control target can be enhanced.

In one or more embodiments, the first adjustment apparatus includes a first tank for storing the first heat transfer medium, and the first tank stores the first heat transfer medium whose temperature has been adjusted to the first temperature. Also, the second adjustment apparatus includes a second tank for storing the second heat transfer medium, and the second tank stores the second heat transfer medium whose temperature has been adjusted to the second temperature.

According to the above-described configuration, the first adjustment apparatus includes the first tank for storing the first heat transfer medium, and the first tank stores the first heat transfer medium whose temperature has been adjusted to the first temperature. Therefore, the first heat transfer medium whose temperature has been adjusted to the first temperature and which is used for heat exchange can be supplied sufficiently from the first tank of the first adjustment apparatus. Even in such a case, since the first heat transfer medium whose usable temperature range is narrower than that of the third heat transfer medium is used, an inexpensive heat transfer medium can be used as the first heat transfer medium. Similarly, in the second circulation circuit, the second heat transfer medium whose usable temperature range is narrower than that of the third heat transfer medium is used. Therefore, an inexpensive heat transfer medium can be used as the second heat transfer medium.

In one or more embodiments, the first circulation circuit includes a first heat storage section (i.e., first heat storage) through which the first heat transfer medium flows and which stores thermal energy as a result of a state change of a first heat storage material at a third temperature. The first heat transfer medium supplied from the first adjustment apparatus flows to the first flow-through section and the first heat storage section through the first supply path, and the first heat transfer medium having flowed through the first flow-through section and the first heat storage section flows to the first adjustment apparatus through the first return path. Also, the second circulation circuit includes a second heat storage section (i.e., second heat storage) through which the second heat transfer medium flows and which stores thermal energy as a result of a state change of a second heat storage material at a fourth temperature higher than the third temperature. The second heat transfer medium supplied from the second adjustment apparatus flows to the second flow-through section and the second heat storage section through the second supply path, and the second heat transfer medium having flowed through the second flow-through section and the second heat storage section flows to the second adjustment apparatus through the second return path.

According to the above-described configuration, the first circulation circuit includes the first heat storage section, the first supply path through which the first heat transfer medium supplied from the first adjustment apparatus flows to the first flow-through section and the first heat storage section, and the first return path through which the first heat transfer medium having flowed through the first flow-through section and the first heat storage section flows to the first adjustment apparatus. Therefore, thermal energy can be supplied to the first flow-through section and the first heat storage section via the first heat transfer medium. The first heat storage section, through which the first heat transfer medium flows, stores thermal energy as a result of the state change of the first heat storage material at the third temperature. Therefore, thermal energy can be stored in the first heat storage section, for example, for preparation for changing the temperature of the control target. Also, in the second circulation circuit, the second adjustment apparatus adjusts the temperature of the second heat transfer medium to the second temperature higher than the first temperature. Therefore, the second circulation circuit can achieve the same action and effect as those of the first circulation circuit, by its configuration similar to that of the first circulation circuit.

When the thermal energy supplied to the third flow-through section and the fourth flow-through section is adjusted by the adjustment section, the thermal energies stored in the first heat storage section and the second heat storage section can be used. Therefore, the amount of thermal energy supplied to the third flow-through section and the fourth flow-through section can be increased, and the temperature of the third heat transfer medium can be changed quickly. Accordingly, responsiveness in controlling the temperature of the control target can be enhanced further.

In one or more embodiments, the adjustment section includes a first distribution valve which is provided in the first supply path and changes the ratio at which the first heat transfer medium supplied from the first adjustment apparatus is distributed between the first flow-through section and the first heat storage section, and a second distribution valve which is provided in the second supply path and changes the ratio at which the second heat transfer medium supplied from the second adjustment apparatus is distributed between the second flow-through section and the second heat storage section.

According to the above-described configuration, the first distribution valve is provided in the first supply path so as to change the ratio at which the first heat transfer medium supplied from the first adjustment apparatus is distributed between the first flow-through section and the first heat storage section. Therefore, the ratio between thermal energy supplied from the first adjustment apparatus to the first flow-through section and thermal energy supplied from the first adjustment apparatus to the first heat storage section can be changed by the first distribution valve. Accordingly, the ratio between the thermal energy used for heat exchange between the first flow-through section and the third flow-through section and the thermal energy stored in the first heat storage section can be changed. Similarly, the ratio between the thermal energy used for heat exchange between the second flow-through section and the fourth flow-through section and the thermal energy stored in the second heat storage section can be changed.

In one or more embodiments, the temperature control system includes a control section (i.e., controller) which controls the first distribution valve and the second distribution valve. When the control section controls the first distribution valve such that the first heat transfer medium supplied from the first adjustment apparatus flows to the first flow-through section, the control section controls the second distribution valve such that the second heat transfer medium supplied from the second adjustment apparatus flows to the second heat storage section. When the control section controls the second distribution valve such that the second heat transfer medium supplied from the second adjustment apparatus flows to the second flow-through section, the control section controls the first distribution valve such that the first heat transfer medium supplied from the first adjustment apparatus flows to the first heat storage section.

According to the above-described configuration, the temperature control system includes the control section for controlling the first distribution valve and the second distribution valve. When the control section controls the first distribution valve such that the first heat transfer medium supplied from the first adjustment apparatus flows to the first flow-through section, the control section controls the second distribution valve such that the second heat transfer medium supplied from the second adjustment apparatus flows to the second heat storage section. Therefore, in the case where the first heat transfer medium supplied from the first adjustment apparatus is caused to flow through the first flow-through section; namely, in the case where the necessity of heat exchange between the second flow-through section and the fourth flow-through section is small, thermal energy can be stored in the second heat storage section. Meanwhile, in the case where the second heat transfer medium supplied from the second adjustment apparatus is caused to flow through the second flow-through section; namely, in the case where the necessity of heat exchange between the first flow-through section and the third flow-through section is small, thermal energy can be stored in the first heat storage section.

In one or more embodiments, the first heat storage section includes a first heat radiation flow-through section (i.e., first heat radiation flow-through path) through which the first heat transfer medium having flowed through the first flow-through section flows, and a first heat storage flow-through section (i.e., first heat storage flow-through path) which is independent of the first heat radiation flow-through section and through which the first heat transfer medium not having flowed through the first flow-through section flows. Also, the second heat storage section includes a second heat radiation flow-through section (i.e., second heat radiation flow-through path) through which the second heat transfer medium having flowed through the second flow-through section flows, and a second heat storage flow-through section (i.e., second heat storage flow-through path) which is independent of the second heat radiation flow-through section and through which the second heat transfer medium not having flowed through the second flow-through section flows.

According to the above-described configuration, the first heat transfer medium having flowed through the first flow-through section and the first heat transfer medium not having flowed through the first flow-through section can be caused to flow to the first heat storage section independently of each other. Therefore, the efficiency in storing thermal energy in the first heat storage section can be increased, as compared with a configuration in which the first heat transfer medium having flowed through the first flow-through section and the first heat transfer medium not having flowed through the first flow-through section are mixed in the first heat storage section. Similarly, the efficiency in storing thermal energy in the second heat storage section can be increased.

In one or more embodiments, the pressure loss of the first heat transfer medium in the first distribution valve is constant irrespective of the ratio at which the first heat transfer medium supplied from the first adjustment apparatus is distributed between the first flow-through section and the first heat storage section, and the pressure loss of the second heat transfer medium in the second distribution valve is constant irrespective of the ratio at which the second heat transfer medium supplied from the second adjustment apparatus is distributed between the second flow-through section and the second heat storage section.

According to the above-described configuration, in the first distribution valve, the pressure loss of the first heat transfer medium is constant irrespective of the ratio at which the first heat transfer medium supplied from the first adjustment apparatus is distributed between the first flow-through section and the first heat storage section. Therefore, it is possible to prevent application of load to the first adjustment apparatus due to a variation in the pressure loss of the first heat transfer medium. Further, in the case where the first heat transfer medium is caused to circulate through the first circulation circuit by a pump, since the pressure loss of the first heat transfer medium in the first distribution valve is constant, it is unnecessary to control the drive state of the pump, and the pump can be driven in a constant drive state. The same action and effect as those of the first circulation circuit can be achieved in the second circulation circuit as well.

In one or more embodiments, the adjustment section includes a third distribution valve which is provided in the third return path and which changes the ratio between the third heat transfer medium flowing from the heat exchange section to the third flow-through section and the third heat transfer medium flowing from the heat exchange section to the fourth flow-through section.

According to the above-described configuration, the third distribution valve is provided in the third return path so as to change the ratio between the third heat transfer medium flowing from the heat exchange section to the third flow-through section and the third heat transfer medium flowing from the heat exchange section to the fourth flow-through section. Therefore, the ratio between the thermal energy that the third flow-through section receives from the first flow-through section and the thermal energy that the fourth flow-through section receives from the second flow-through section can be changed by the third distribution valve. Further, for example, by causing the third heat transfer medium to flow from the heat exchange section only to the fourth flow-through section, it is possible to prevent the heat exchange between the first flow-through section and the third flow-through section, which heat exchange would otherwise occur when the third heat transfer medium flows to the third flow-through section. Notably, in the case where the third heat transfer medium flows through the third flow-through section, even when the first heat transfer medium does not flow through the first flow-through section, the thermal energy remaining in the first flow-through section may be supplied to the third flow-through section. From this viewpoint, the above-described configuration can further enhance responsiveness in controlling the temperature of the control target.

In one or more embodiments, the adjustment section includes a third distribution valve which is provided in the third return path and which changes the ratio between the third heat transfer medium flowing from the heat exchange section to the third flow-through section and the third heat transfer medium flowing from the heat exchange section to the fourth flow-through section, and the temperature control system includes a control section which controls the first distribution valve, the second distribution valve, and the third distribution valve. When the control section controls the third distribution valve such that the third heat transfer medium does not flow from the heat exchange section to the third flow-through section, the control section controls the first distribution valve such that the first heat transfer medium supplied from the first adjustment apparatus flows to the first heat storage section. When the control section controls the third distribution valve such that the third heat transfer medium does not flow from the heat exchange section to the fourth flow-through section, the control section controls the second distribution valve such that the second heat transfer medium supplied from the second adjustment apparatus flows to the second heat storage section.

According to the above-described configuration, the temperature control system includes the control section for controlling the first distribution valve, the second distribution valve, and the third distribution valve. In the case where the control section controls the third distribution valve such that the third heat transfer medium does not flow from the heat exchange section to the third flow-through section, the control section controls the first distribution valve such that the first heat transfer medium supplied from the first adjustment apparatus flows to the first heat storage section. Therefore, in the case where the third heat transfer medium is not caused to flow from the heat exchange section to the third flow-through section; namely, in the case where it is unnecessary to perform heat exchange between the first flow-through section and the third flow-through section, thermal energy can be stored in the first heat storage section. Meanwhile, in the case where the third heat transfer medium is not caused to flow from the heat exchange section to the fourth flow-through section; namely, in the case where it is unnecessary to perform heat exchange between the second flow-through section and the fourth flow-through section, thermal energy can be stored in the second heat storage section.

In one or more embodiments, the third return path includes a first intermediary return path through which the third heat transfer medium flows from the heat exchange section to the third flow-through section through the first heat storage section, and a second intermediary return path through which the third heat transfer medium flows from the heat exchange section to the fourth flow-through section through the second heat storage section.

According to the above-described configuration, the third return path includes the first intermediary return path through which the third heat transfer medium flows from the heat exchange section to the third flow-through section through the first heat storage section. Therefore, in the case where the third heat transfer medium is caused to flow from the heat exchange section to the third flow-through section, thermal energy can be supplied directly to the third heat transfer medium from the first heat storage section. Similarly, in the case where the third heat transfer medium is caused to flow from the heat exchange section to the fourth flow-through section, thermal energy can be supplied directly to the third heat transfer medium from the second heat storage section. Accordingly, responsiveness in controlling the temperature of the control target can be enhanced further.

In one or more embodiments, the pressure loss of the third heat transfer medium in the third distribution valve is constant irrespective of the ratio between the third heat transfer medium flowing from the heat exchange section to the third flow-through section and the third heat transfer medium flowing from the heat exchange section to the fourth flow-through section. Therefore, in the case where the third heat transfer medium is caused to flow through the third circulation circuit by a pump, it is unnecessary to control the drive state of the pump, and the pump can be driven in a constant drive state.

In one or more embodiments, the adjustment section includes a fourth distribution valve which is provided in the third return path and which changes the ratio among the third heat transfer medium flowing from the heat exchange section to the third flow-through section, the third heat transfer medium flowing out of the heat exchange section and returning to the heat exchange section without flowing through the third flow-through section and the fourth flow-through section, and the third heat transfer medium flowing from the heat exchange section to the fourth flow-through section.

According to the above-described configuration, the fourth distribution valve is provided in the third return path so as to change the ratio among the third heat transfer medium flowing from the heat exchange section to the third flow-through section, the third heat transfer medium flowing out of the heat exchange section and returning to the heat exchange section without flowing through the third flow-through section and the fourth flow-through section, and the third heat transfer medium flowing from the heat exchange section to the fourth flow-through section. Therefore, the ratio among the thermal energy that the third flow-through section receives from the first flow-through section, the thermal energy returned to the heat exchange section, and the thermal energy that the fourth flow-through section receives from the second flow-through section can be changed by the fourth distribution valve. Further, it is possible to realize a state in which the third heat transfer medium flowing out of the heat exchange section is returned as it is to the heat exchange section without allowing the third heat transfer medium to flow from the heat exchange section to the third flow-through section and the fourth flow-through section.

In one or more embodiments, the temperature control system further includes a fourth circulation circuit which is independent of the first circulation circuit, the second circulation circuit, and the third circulation circuit and through which a fourth heat transfer medium flows. The usable temperature range of the third heat transfer medium is wider than a usable temperature range of the fourth heat transfer medium.

The fourth circulation circuit includes a third adjustment apparatus which adjusts the temperature of the fourth heat transfer medium to a fifth temperature lower than the first temperature and discharges the temperature-adjusted fourth heat transfer medium, a fifth flow-through section (i.e., fifth flow-through path) through which the fourth heat transfer medium flows, a fourth supply path through which the fourth heat transfer medium supplied from the third adjustment apparatus flows to the fifth flow-through section, and a fourth return path through which the fourth heat transfer medium having flowed through the fifth flow-through section flows to the third adjustment apparatus.

The third circulation circuit includes a sixth flow-through section (i.e., sixth flow-through path) through which the third heat transfer medium flows and which changes heat with the fifth flow-through section. The third heat transfer medium flows from the third flow-through section, the fourth flow-through section, and the sixth flow-through section to the heat exchange section through the third supply path, and the third heat transfer medium flows from the heat exchange section to the third flow-through section, the fourth flow-through section, and the sixth flow-through section through the third return path.

The adjustment section is provided in the third return path and controls the ratio among the third heat transfer medium flowing from the heat exchange section to the third flow-through section, the third heat transfer medium flowing from the heat exchange section to the fourth flow-through section, and the third heat transfer medium flowing from the heat exchange section to the sixth flow-through section.

According to the above-described configuration, in the fourth circulation circuit, the third adjustment apparatus adjusts the temperature of the fourth heat transfer medium to the fifth temperature lower than the first temperature. Therefore, the fourth circulation circuit can achieve the same action and effect as those of the first circulation circuit, by its configuration similar to that of the first circulation circuit. The adjustment section is provided in the third return path and changes the ratio among the third heat transfer medium flowing from the heat exchange section to the third flow-through section, the third heat transfer medium flowing from the heat exchange section to the fourth flow-through section, and the third heat transfer medium flowing from the heat exchange section to the sixth flow-through section. Therefore, it is possible to change the ratio among the thermal energy that the third flow-through section receives from the first flow-through section, the thermal energy that the fourth flow-through section receives from the second flow-through section, and the thermal energy that the sixth flow-through section receives from the fifth flow-through section. Accordingly, for example, when the temperature of the control target is lowered to a temperature near the first temperature, the temperature of the control target can be lowered rapidly by temporarily supplying the third heat transfer medium to the sixth flow-through section. As a result, responsiveness in controlling the temperature of the control target can be enhanced further.

Specifically, as in one or more embodiments, the following configuration can be employed. The adjustment section includes a fifth distribution valve and a sixth distribution valve which are provided in the third return path. The fifth distribution valve changes the ratio between the third heat transfer medium flowing from the heat exchange section to the fourth flow-through section and the third heat transfer medium flowing from the heat exchange section to the sixth distribution valve. The sixth distribution valve changes the ratio between the third heat transfer medium flowing from the fifth distribution valve to the third flow-through section and the third heat transfer medium flowing from the fifth distribution valve to the sixth flow-through section. By virtue of such a configuration, the ratio among the third heat transfer medium flowing from the heat exchange section to the third flow-through section, the third heat transfer medium flowing from the heat exchange section to the fourth flow-through section, and the third heat transfer medium flowing from the heat exchange section to the sixth flow-through section can be changed freely by the two distribution valves.

In one or more embodiments, an integrated temperature control system includes a plurality of temperature control systems according to any of the above-described embodiments, wherein the first adjustment apparatus is a single one shared by the plurality of temperature control systems. By virtue of such a configuration, since the single first adjustment apparatus which adjusts the temperature of the first heat transfer medium to the first temperature lower than the second temperature and discharges the temperature-adjusted first heat transfer medium can be shared by the plurality of temperature control systems. Therefore, a refrigerator whose cooling capacity is, for example, 10 to 100 times the cooling capacity of an ordinary chiller can be employed as the first adjustment apparatus, whereby the configuration of the integrated temperature control system including the plurality of temperature control systems can be simplified.

Each of the temperature control systems controls the temperature of the control target by adjusting the amount of heat exchanged between the first flow-through section and the third flow-through section and the amount of heat exchanged between the second flow-through section and the fourth flow-through section by using the adjustment section. Therefore, the first adjustment apparatus is required only to adjust the temperature of the first heat transfer medium to the constant first temperature and discharge the temperature-adjusted first heat transfer medium, and is not required to change the temperature of the first heat transfer medium in accordance with a change in the target temperature of the control target. Accordingly, even in the case of a configuration in which a single first adjustment apparatus is provided for a plurality of temperature control systems, the temperature of the control target of each temperature control system can be controlled.

According to one or more embodiments, an integrated temperature control system includes a plurality of temperature control systems according to any of the above-described embodiments, wherein a plurality of the first adjustment apparatuses discharge the first heat transfer medium whose temperature has been adjusted to the first temperature to a common supply header and suck the first heat transfer medium from a common return header, the first supply paths of the plurality of temperature control systems are connected to the supply header, and the first return paths of the plurality of temperature control systems are connected to the return header.

According to the above-described configuration, the plurality of first adjustment apparatuses discharge to the common supply header the first heat transfer medium adjusted to the first temperature. The first supply paths of the plurality of temperature control systems are connected to the common supply header. Therefore, the first heat transfer medium of the first temperature discharged from the plurality of first adjustment apparatuses can be stored in the common supply header. Even in the case where the capacity of a single first adjustment apparatus is insufficient to supply the first heat transfer medium of the first temperature (e.g., the case where the temperature of a certain control target is to be lowered rapidly), the first heat transfer medium of the first temperature can be supplied sufficiently from the supply header.

The first return paths of the plurality of temperature control systems are connected to the common return header, and the plurality of first adjustment apparatuses suck the first heat transfer medium from the return header. Therefore, the first heat transfer mediums returned from the first return paths of the plurality of temperature control systems can be mixed in the return header. Accordingly, the first heat transfer medium can be returned to each first adjustment apparatus after the temperature of the first heat transfer medium has been averaged, whereby the cooling loads of the plurality of first adjustment apparatuses are prevented from becoming unbalance.

In one or more embodiments, the number of the first adjustment apparatuses to be operated is set in accordance with the total of cooling loads of the first adjustment apparatuses, and the first adjustment apparatuses are operated such that operating times of the first adjustment apparatuses become uniform.

According to the above-described configuration, the number of the first adjustment apparatuses to be operated is set in accordance the total of the cooling loads of the plurality of first adjustment apparatuses. Therefore, the number of the first adjustment apparatuses to be operated can be set properly, and the operating efficiencies of the first adjustment apparatuses can be improved. Further, the plurality of first adjustment apparatuses are operated such that operating time become uniform among the plurality of first adjustment apparatuses. Therefore, it is possible to prevent occurrence of a situation in which only the operating time of a particular first adjustment apparatus becomes long, thereby preventing the life of the particular first adjustment apparatus from becoming short.

BRIEF DESCRIPTION OF THE DRAWINGS

The above and other features and advantages of the present invention will be apparent from the following description made with reference to the accompanying drawings.

DETAILED DESCRIPTION

First Embodiment

A first embodiment will now be described with reference to the drawings. The first embodiment is embodied as a temperature control system for controlling the temperature of a lower electrode (control target) of a semiconductor manufacturing apparatus.

Figure 1:
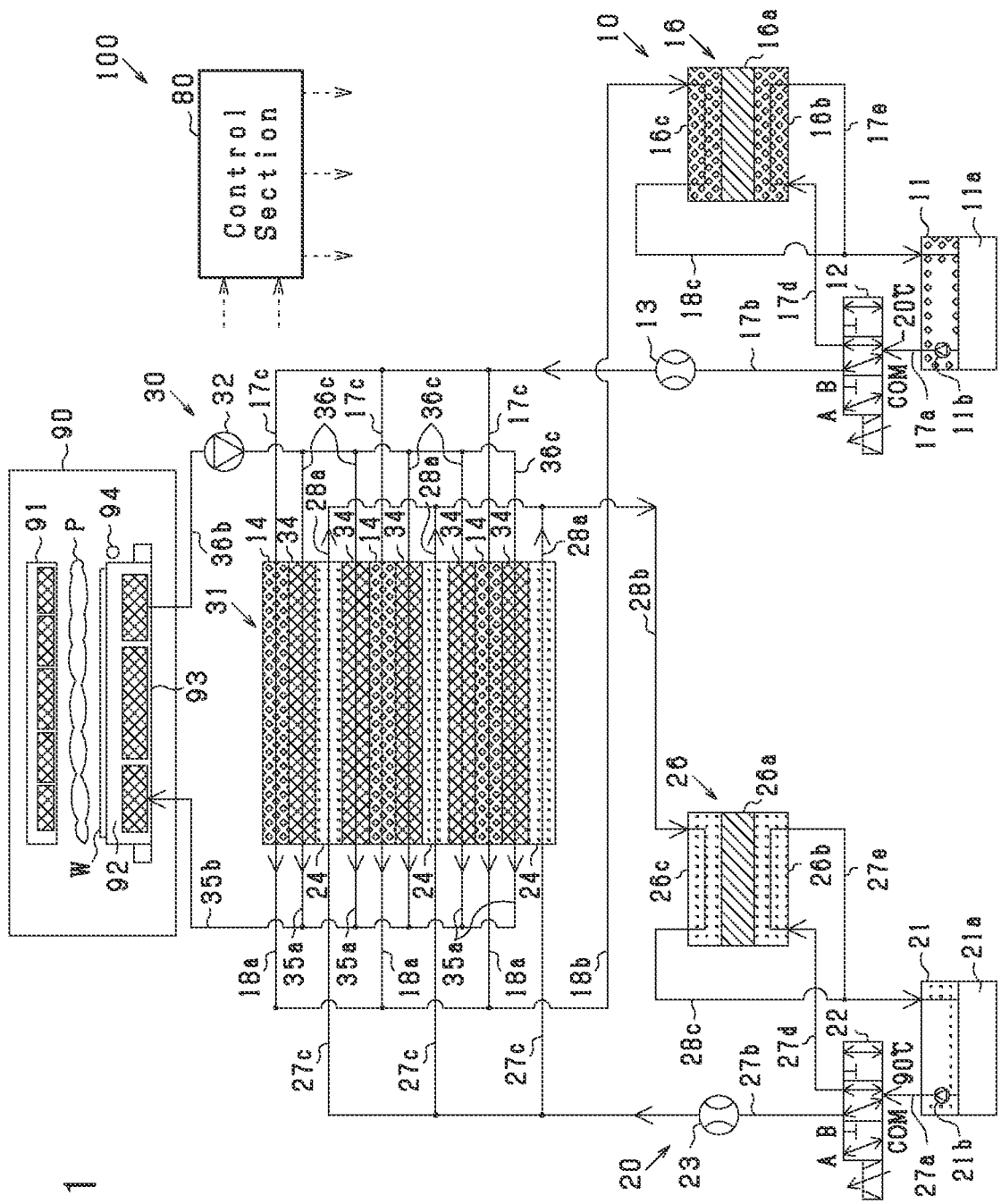
FIG. 1 is a schematic diagram of a temperature control system according to a first embodiment.

As shown in FIG. 1, a temperature control system 100 includes a first circulation circuit 10, a second circulation circuit 20, a third circulation circuit 30, a control section 80, etc.

The first circulation circuit 10 is a circuit through which a first heat transfer medium circulates. The first heat transfer medium is, for example, a liquid composed of ethylene glycol (60%) and water (40%). The second circulation circuit 20 is a circuit which is independent of the first circulation circuit 10 and through which a second heat transfer medium circulates. The second heat transfer medium is, for example, the same liquid as the first heat transfer medium. The first heat transfer medium and the second heat transfer medium are relatively inexpensive.

The third circulation circuit 30 is a circuit which is independent of the first circulation circuit 10 and the second circulation circuit 20 and through which a third heat transfer medium circulates. The third heat transfer medium is, for example, a fluorine-based inert liquid. The lowest usable temperature of the third heat transfer medium is lower than those of the first heat transfer medium and the second heat transfer medium. The highest usable temperature of the third heat transfer medium is higher than those of the first heat transfer medium and the second heat transfer medium. Namely, the usable temperature range of the third heat transfer medium is wider than those of the first heat transfer medium and the second heat transfer medium. Therefore, the third heat transfer medium is more expensive than the first heat transfer medium and the second heat transfer medium.

The first circulation circuit 10 includes a first chiller 11, a first distribution valve 12, a flowmeter 13, three (a plurality of) first flow-through sections 14, a first heat storage unit 16, etc.

The first chiller 11 (first adjustment apparatus) includes a tank 11a, a pump 11b, etc. The first chiller 11 adjusts the temperature of the first heat transfer medium to −20° C. (first temperature). The tank 11a (first tank) stores the first heat transfer medium adjusted to −20° C. The pump 11b discharges to a flow passage 17a the first heat transfer medium stored in the tank 11a. The flow passage 17a is connected to the common port (COM) of the first distribution valve 12.

The first distribution valve 12 (adjustment section) is a three-way valve having the common port, an A port, and a B port. A flow passage 17b is connected to the A port. A flow passage 17d is connected to the B port. The first distribution valve 12 continuously changes the ratio between the flow rate of the first heat transfer medium flowing from the flow passage 17a to the flow passage 17b and the flow rate of the first heat transfer medium flowing from the flow passage 17a to the flow passage 17d. The first distribution valve 12 continuously changes the state of flow between a state in which all (100%) of the first heat transfer medium flows from the flow passage 17a to the flow passage 17b and a state in which all (100%) of the first heat transfer medium flows from the flow passage 17a to the flow passage 17d. In the first distribution valve 12, the pressure loss of the first heat transfer medium is constant irrespective of the ratio at which the first heat transfer medium supplied from the first chiller 11 is distributed between the three first flow-through sections 14 and a first heat storage flow-through section 16b of the first heat storage unit 16. Since the load of the pump 11b does not change irrespective of the distribution ratio of the first distribution valve 12, the pump 11b is driven in a constant drive state.

The flowmeter 13 is provided in the flow passage 17b. The flowmeter 13 measures the flow rate of the first heat transfer medium flowing through the flow passage 17b. The flow passage 17b is branched into three (a plurality of) flow passages 17c. The flow passages 17c are connected to the respective first flow-through sections 14. The three first flow-through sections 14 are provided in the heat exchanger 31, and the first heat transfer medium flows through the three first flow-through sections 14.

Flow passages 18a are connected to the respective first flow-through sections 14. The three (a plurality of) flow passages 18a merge into a flow passage 18b.

The first heat storage unit 16 (first heat storage section) includes a first heat storage material 16a, a first heat storage flow-through section 16b, and a first heat radiation flow-through section 16c. The first heat storage material 16a stores, as thermal energy, latent heat absorbed or released during a state change between solid and liquid. The first heat storage material 16a changes its state between solid and liquid at −10° C. (third temperature). The state change temperature and stored thermal energy of the first heat storage material 16a can be adjusted by changing the component ratio of the first heat storage material 16a. The first heat storage flow-through section 16b and the first heat radiation flow-through section 16c are integrated with the first heat storage material 16a. Heat exchange is performed between the first heat storage flow-through section 16b and the first heat storage material 16a, and heat exchange is performed between the first heat radiation flow-through section 16c and the first heat storage material 16a.

The first heat storage flow-through section 16b is connected to the above-described flow passage 17d, and the first heat transfer medium flows through the first heat storage flow-through section 16b. A flow passage 17e is connected to the first heat storage flow-through section 16b. The first heat radiation flow-through section 16c is connected to the above-described flow passage 18b, and the first heat transfer medium flows through the first heat radiation flow-through section 16c. A flow passage 18c is connected to the first heat radiation flow-through section 16c. The flow passage 18c is connected to the tank 11a of the first chiller 11. The flow passage 17e is connected to the flow passage 18c. Notably, the flow passages 17a, 17b, 17c, and 17d form a first supply path. The flow passages 18a, 18b, and 18c form a first return path.

The first distribution valve 12 change the ratio at which the first heat transfer medium supplied from the first chiller 11 through the flow passage 17a is distributed between the three first flow-through sections 14 and the first heat storage flow-through section 16b of the first heat storage unit 16. The first heat transfer medium having flowed through the first flow-through sections 14 flows through the first heat radiation flow-through section 16c. The first heat transfer medium not having flowed through the first flow-through sections 14 flows through the first heat storage flow-through section 16b. Namely, the first heat storage flow-through section 16b and the first heat radiation flow-through section 16c are independent of each other.

When the first heat transfer medium of −20° C. flows through the first heat storage flow-through section 16b, the first heat storage material 16a changes its state to solid at −10° C., thereby storing latent heat as thermal energy. When the first heat transfer medium having a temperature higher than −10° C. flows through the first heat radiation flow-through section 16c, the latent heat (thermal energy) stored in the first heat storage material 16a is used for cooling of the first heat transfer medium.

The second circulation circuit 20 includes a second chiller 21, a second distribution valve 22, a flowmeter 23, three (a plurality of) second flow-through sections 24, a second heat storage unit 26, etc.

The second chiller 21 (second adjustment apparatus) includes a tank 21a, a pump 21b, etc. The second chiller 21 adjusts the temperature of the second heat transfer medium to 90° C. (second temperature) which is higher than −20° C. (first temperature). The tank 21a (second tank) stores the second heat transfer medium adjusted to 90° C. The pump 21b discharges to a flow passage 27a the second heat transfer medium stored in the tank 21a. The flow passage 27a is connected to the common port (COM) of the second distribution valve 22.

The second distribution valve 22 (adjustment section) is a three-way valve having the common port, an A port, and a B port. A flow passage 27b is connected to the A port. A flow passage 27d is connected to the B port. The second distribution valve 22 continuously changes the ratio between the flow rate of the second heat transfer medium flowing from the flow passage 27a to the flow passage 27b and the flow rate of the second heat transfer medium flowing from the flow passage 27a to the flow passage 27d. The second distribution valve 22 continuously changes the state of flow between a state in which all (100%) of the second heat transfer medium flows from the flow passage 27a to the flow passage 27b and a state in which all (100%) of the second heat transfer medium flows from the flow passage 27a to the flow passage 27d. In the second distribution valve 22, the pressure loss of the second heat transfer medium is constant irrespective of the ratio at which the second heat transfer medium supplied from the second chiller 21 is distributed between the three second flow-through sections 24 and a second heat storage flow-through section 26b of the second heat storage unit 26. Since the load of the pump 21b does not change irrespective of the distribution ratio of the second distribution valve 22, the pump 21b is driven in a constant drive state.

The flowmeter 23 is provided in the flow passage 27b. The flowmeter 23 measures the flow rate of the second heat transfer medium flowing through the flow passage 27b. The flow passage 27b is branched into three (a plurality of) flow passages 27c. The flow passages 27c are connected to the respective second flow-through sections 24. The three second flow-through sections 24 are provided in the heat exchanger 31, and the second heat transfer medium flows through the three second flow-through sections 24.

Flow passages 28a are connected to the respective second flow-through sections 24. The three (a plurality of) flow passages 28a merge into a flow passage 28b.

The second heat storage unit 26 (second heat storage section) includes a second heat storage material 26a, a second heat storage flow-through section 26b, and a second heat radiation flow-through section 26c. The second heat storage material 26a stores, as thermal energy, latent heat absorbed or released during a state change between solid and liquid. The second heat storage material 26a changes its state between solid and liquid at 100° C. (fourth temperature) which is higher than −10° C. (third temperature). The state change temperature and stored thermal energy of the second heat storage material 26a can be adjusted by changing the component ratio of the second heat storage material 26a. The second heat storage flow-through section 26b and the second heat radiation flow-through section 26c are integrated with the second heat storage material 26a. Heat exchange is performed between the second heat storage flow-through section 26b and the second heat storage material 26a, and heat exchange is performed between the second heat radiation flow-through section 26c and the second heat storage material 26a.

The second heat storage flow-through section 26b is connected to the above-described flow passage 27d, and the second heat transfer medium flows through the second heat storage flow-through section 26b. A flow passage 27e is connected to the second heat storage flow-through section 26b. The second heat radiation flow-through section 26c is connected to the above-described flow passage 28b, and the second heat transfer medium flows through the second heat radiation flow-through section 26c. A flow passage 28c is connected to the second heat radiation flow-through section 26c. The flow passage 28c is connected to the tank 21a of the second chiller 21. The flow passage 27e is connected to the flow passage 28c. Notably, the flow passages 27a, 27b, 27c, and 27d form a second supply path. The flow passages 28a, 28b, and 28c form a second return path.

The second distribution valve 22 changes the ratio at which the second heat transfer medium supplied from the second chiller 21 through the flow passage 27a is distributed between the three second flow-through sections 24 and the second heat storage flow-through section 26b of the second heat storage unit 26. The second heat transfer medium having flowed through the second flow-through sections 24 flows through the second heat radiation flow-through section 26c. The second heat transfer medium not having flowed through the second flow-through sections 24 flows through the second heat storage flow-through section 26b. Namely, the second heat storage flow-through section 26b and the second heat radiation flow-through section 26c are independent of each other.

When the second heat transfer medium of 90° C. flows through the second heat storage flow-through section 26b, the second heat storage material 26a changes its state to solid at 100° C., thereby storing latent heat as thermal energy. When the first heat transfer medium having a temperature higher than 100° C. flows through the second heat radiation flow-through section 26c, the latent heat (thermal energy) stored in the second heat storage material 26a is used for cooling of the second heat transfer medium.

The third circulation circuit 30 includes five (a plurality of) common flow-through sections 34, a pump 32, etc.

The five common flow-through sections 34 (third flow-through section, fourth flow-through section) are provided in the heat exchanger 31, and the third heat transfer medium flows through the common flow-through sections 34. The common flow-through sections 34 are integrated with the first flow-through sections 14 and the second flow-through sections 24. Heat exchange is performed between the common flow-through sections 34 and the first flow-through sections 14, and heat exchange is performed between the common flow-through sections 34 and the second flow-through sections 24.

Flow passages 35a are connected to the respective common flow-through sections 34. The five (a plurality of) flow passages 35a merge into a flow passage 35b.

A semiconductor manufacturing apparatus 90 includes an upper electrode 91 and a lower electrode 92, and generates plasma P between the upper electrode 91 and the lower electrode 92. A workpiece W such as a wafer is placed on the lower electrode 92. A temperature sensor 94 detects the temperature of the lower electrode 92. The lower electrode 92 is integrated with a heat exchanger 93. Heat exchange is performed between the heat exchanger 93 and the lower electrode 92.

The heat exchanger 93 (heat exchange section) is connected to the above-described flow passage 35b, and the third heat transfer medium flows through the heat exchanger 93. A flow passage 36b is connected to the heat exchanger 93. A pump 32 is provided in the flow passage 36b. The flow passage 36b is branched to five (a plurality of) flow passages 36c. The flow passages 36c are connected to the respective common flow-through sections 34.

In the flow passage 36b, the pump 32 sucks the third heat transfer medium from the heat exchanger 93 side and discharges the third heat transfer medium toward the common flow-through sections 34. The pump 32 is driven in a constant drive state. As a result, the pump 32 circulates the third heat transfer medium through the third circulation circuit 30. The third circulation circuit 30 does not include a tank for storing the third heat transfer medium. Notably, the flow passages 35a and 35b form a third supply path. The flow passages 36b and 36c form a third return path.

The control section 80 is a microcomputer including a CPU, a ROM, a RAM, an input/output interface, etc. The control section 80 receives detection results from the flowmeters 13 and 23, the temperature sensor 94, etc. The control section 80 controls the temperature of the lower electrode 92 to a set temperature. The set temperature (target temperature) is changed to, for example, 90° C., 0° C., or −20° C. in accordance with a process in the semiconductor manufacturing apparatus 90. Since heat flows from the plasma P into the lower electrode 92, the temperature of the lower electrode 92 may rise to about 120° C. upon generation of the plasma P. As a result of the temperature rise, the temperature of the third heat transfer medium flowing out of the heat exchanger 93 may also rise to a temperature close to 120° C.

The control section 80 controls the distribution ratios of the first distribution valve 12 and the second distribution valve 22 on the basis of the set temperature of the lower electrode 92 and the results of the detections performed by the flowmeters 13 and 23 and the temperature sensor 94. Thus, the flow rate of the first heat transfer medium flowing through the first flow-through sections 14 is adjusted; as a result, the amount of heat exchanged between the first flow-through sections 14 and the common flow-through sections 34 (third flow-through section) is adjusted. Also, the flow rate of the second heat transfer medium flowing through the second flow-through sections 24 is adjusted; as a result, the amount of heat exchanged between the second flow-through sections 24 and the common flow-through sections 34 (fourth flow-through section) is adjusted.

Further, when the first heat transfer medium supplied from the first chiller 11 is caused by the first distribution valve 12 to flow to the first flow-through sections 14, the control section 80 controls the second distribution valve 22 such that the second heat transfer medium supplied from the second chiller 21 flows to the second heat storage unit 26. For example, when all (100%, which is greater than the predetermined distribution ratio) of the first heat transfer medium supplied from the first chiller 11 is caused by the first distribution valve 12 to flow to the first flow-through sections 14, the control section 80 controls the second distribution valve 22 such that all (100%, which is greater than the predetermined distribution ratio) of the second heat transfer medium supplied from the second chiller 21 flows to the second heat storage unit 26. As a result, the second heat storage material 26a changes its state to solid at 100° C., whereby thermal energy is stored in the second heat storage unit 26. When the second heat transfer medium whose temperature is higher than 100° C. flows through the second heat radiation flow-through section 26c, the thermal energy stored in the second heat storage material 26a is used for cooling of the second heat transfer medium.

Also, when the second heat transfer medium supplied from the second chiller 21 is caused by the second distribution valve 22 to flow to the second flow-through sections 24, the control section 80 controls the first distribution valve 12 such that the first heat transfer medium supplied from the first chiller 11 flows to the first heat storage unit 16. For example, when all (100%, which is greater than the predetermined distribution ratio) of the second heat transfer medium supplied from the second chiller 21 is caused by the second distribution valve 22 to flow to the second flow-through sections 24, the control section 80 controls the first distribution valve 12 such that all (100%, which is greater than the predetermined distribution ratio) of the first heat transfer medium supplied from the first chiller 11 flows to the first heat storage unit 16. As a result, the first heat storage material 16a changes its state to solid at −10° C., whereby thermal energy is stored in the first heat storage unit 16. When the first heat transfer medium whose temperature is higher than −10° C. flows through the first heat radiation flow-through section 16c, the thermal energy stored in the first heat storage material 16a is used for cooling of the first heat transfer medium.

The first embodiment of the present invention having been described in detail above has the following advantages.

The third circulation circuit 30 is independent of the first circulation circuit 10 and the second circulation circuit 20, and the third heat transfer medium whose usable temperature range is wider than those of the first heat transfer medium and the second heat transfer medium circulates through the third circulation circuit 30. Therefore, the third heat transfer medium, which may be expensive, is caused to circulate only through the third circulation circuit 30, whereby the amount of the third heat transfer medium to be used can be reduced. Additionally, the third circulation circuit 30 does not include a tank for storing the third heat transfer medium. Therefore, the amount of the third heat transfer medium circulating through the third circulation circuit 30 can be reduced further.

The first heat transfer medium and the second heat transfer medium whose usable temperature ranges are narrower than that of the third heat transfer medium are used in the first circulation circuit 10 and the second circulation circuit 20, respectively. Therefore, inexpensive heat transfer mediums can be used as the first heat transfer medium and the second heat transfer medium.

The third circulation circuit 30 includes the common flow-through sections 34 through which the third heat transfer medium flows and which exchange heat with the first flow-through sections 14, and the common flow-through sections 34 through which the third heat transfer medium flows and which exchange heat with the second flow-through sections 24. Therefore, the thermal energy supplied to the first flow-through sections 14 can be supplied to the common flow-through sections 34 through the heat exchange between the first flow-through sections 14 and the common flow-through sections 34. Similarly, the thermal energy supplied to the second flow-through sections 24 can be supplied to the common flow-through sections 34 through the heat exchange between the second flow-through sections 24 and the common flow-through sections 34.

The third circulation circuit 30 includes the flow passages 35a and 35b through which the third heat transfer medium flows from the common flow-through sections 34 to the heat exchanger 93, which exchanges heat with the lower electrode 92, and the flow passages 36b and 36c through which the third heat transfer medium flows from the heat exchanger 93 to the common flow-through sections 34. Therefore, thermal energy can be supplied through the third heat transfer medium to the heat exchanger 93, which exchanges heat with the lower electrode 92.

The temperature control system 100 includes the first distribution valve 12 and the second distribution valve 22, which adjust the amount of heat exchanged between the first flow-through sections 14 and the common flow-through sections 34 and the amount of heat exchanged between the second flow-through sections 24 and the common flow-through sections 34. Therefore, the thermal energy supplied to the common flow-through sections 34 can be adjusted by the first distribution valve 12 and the second distribution valve 22, whereby the thermal energy supplied to the heat exchanger 93 via the third heat transfer medium can be controlled, and thus, the temperature of the lower electrode 92 can be controlled. As described above, the amount of the third heat transfer medium circulating through the third circulation circuit 30 can be reduced. Accordingly, the temperature of the third heat transfer medium can be changed quickly, whereby responsiveness in controlling the temperature of the lower electrode 92 can be enhanced.

The first chiller 11 includes the tank 11a for storing the first heat transfer medium, and the tank 11a stores the first heat transfer medium adjusted to −20° C. Therefore, the first heat transfer medium which has been adjusted to −20° C. and is used for heat exchange can be supplied sufficiently from the tank 11a of the first chiller 11. Even in such a case, since the first heat transfer medium whose usable temperature range is narrower than that of the third heat transfer medium is used, an inexpensive heat transfer medium can be used as the first heat transfer medium. Similarly, since the second heat transfer medium whose usable temperature range is narrower than that of the third heat transfer medium is used in the second circulation circuit 20, an inexpensive heat transfer medium can be used as the second heat transfer medium.

The first heat storage unit 16, through which the first heat transfer medium flows, stores thermal energy as a result of the state change of the first heat storage material 16a at −10° C. Therefore, thermal energy can be stored in the first heat storage unit 16, for example, for preparation for changing the temperature of the lower electrode 92. Also, in the second circulation circuit 20, the second chiller 21 adjusts the temperature of the second heat transfer medium to 90° C. which is higher than −20° C. Thus, the second circulation circuit 20 can achieve the same action and effect as those of the first circulation circuit 10, by its configuration similar to that of the first circulation circuit 10.

When the thermal energy supplied to the common flow-through sections 34 is adjusted by the first distribution valve 12 and the second distribution valve 22, the thermal energies stored in the first heat storage unit 16 and the second heat storage unit 26 can be used. Therefore, the amount of thermal energy supplied to the common flow-through sections 34 can be increased, and the temperature of the third heat transfer medium can be changed quickly. Accordingly, responsiveness in controlling the temperature of the lower electrode 92 can be enhanced further.

The first distribution valve 12 is provided in the flow passage 17b so as to change the ratio at which the first heat transfer medium supplied from the first chiller 11 is distributed between the first flow-through sections 14 and the first heat storage unit 16. Therefore, the ratio between the thermal energy supplied from the first chiller 11 to the first flow-through sections 14 and the thermal energy supplied from the first chiller 11 to the first heat storage unit 16 can be changed by the first distribution valve 12. Accordingly, it is possible to change the ratio between the thermal energy used for heat exchange between the first flow-through sections 14 and the common flow-through sections 34 and the thermal energy stored in the first heat storage unit 16. Similarly, it is possible to change the ratio between the thermal energy used for heat exchange between the second flow-through sections 24 and the common flow-through sections 34 and the thermal energy stored in the second heat storage unit 26.

The temperature control system 100 includes the control section 80 for controlling the first distribution valve 12 and the second distribution valve 22. When the first heat transfer medium supplied from the first chiller 11 is caused by the first distribution valve 12 to flow to the first flow-through sections 14, the control section 80 controls the second distribution valve 22 such that the second heat transfer medium supplied from the second chiller 21 flows to the second heat storage unit 26. Therefore, in the case where the first heat transfer medium supplied from the first chiller 11 is caused to flow through the first flow-through sections 14; namely, in the case where the necessity of heat exchange between the second flow-through sections 24 and the common flow-through sections 34 is small, thermal energy can be stored in the second heat storage unit 26. Meanwhile, in the case where the second heat transfer medium supplied from the second chiller 21 is caused to flow through the second flow-through sections 24; namely, in the case where the necessity of heat exchange between the first flow-through sections 14 and the common flow-through sections 34 is small, thermal energy can be stored in the first heat storage unit 16.

The first heat transfer medium having flowed through the first flow-through sections 14 and the first heat transfer medium not having flowed through the first flow-through sections 14 can be caused to flow through the first heat storage unit 16 independently of each other. Therefore, the efficiency in storing thermal energy in the first heat storage unit 16 can be increased, as compared with a configuration in which the first heat transfer medium having flowed through the first flow-through sections 14 and the first heat transfer medium not having flowed through the first flow-through sections 14 are mixed in the first heat storage unit 16. Similarly, the efficiency in storing thermal energy in the second heat storage unit 26 can be increased.

In the first distribution valve 12, the pressure loss of the first heat transfer medium is constant irrespective of the ratio at which the first heat transfer medium supplied from the first chiller 11 is distributed between the first flow-through sections 14 and the first heat storage unit 16. Therefore, it is possible to prevent application of a load to the first chiller 11 due to a variation in the pressure loss of the first heat transfer medium. Further, in the case where the first heat transfer medium is circulated through the first circulation circuit 10 by the pump 11b, since the pressure loss of the first heat transfer medium in the first distribution valve 12 is constant, it is unnecessary to control the drive state of the pump 11b. Therefore, the pump 11b can be driven in a constant drive state. In the second circulation circuit 20 as well, the same action and effect as those of the first circulation circuit 10 can be achieved.

Notably, the first embodiment may be modified as follows. Portions identical with those of the first embodiment are denoted by the same reference numerals, and their description will not be repeated.

In the first distribution valve 12, the pressure loss of the first heat transfer medium may change in accordance with the ratio at which the first heat transfer medium supplied from the first chiller 11 is distributed between the first flow-through sections 14 and the first heat storage unit 16. In such a case, the drive state of the pump 11b is changed appropriately. This also applies to the second distribution valve 22.

The flowmeters 13 and 23 may be omitted. In such a case, the control section 80 controls the distribution ratios of the first distribution valve 12 and the second distribution valve 22 (adjustment section) on the basis of the set temperature of the lower electrode 92 and the temperature detected by the temperature sensor 94.

In the case where the first heat transfer medium supplied from the first chiller 11 is not caused by the first distribution valve 12 to flow to the first flow-through sections 14, the control section 80 may control the second distribution valve 22 such that the second heat transfer medium supplied from the second chiller 21 flows to the second heat storage unit 26. In the case where the second heat transfer medium supplied from the second chiller 21 is not caused by the second distribution valve 22 to flow to the second flow-through sections 24, the control section 80 may control the first distribution valve 12 such that the first heat transfer medium supplied from the first chiller 11 flows to the first heat storage unit 16.

Second Embodiment

A second embodiment will now be described. In the following description, the difference between the second embodiment and the first embodiment will be mainly described. Notably, portions identical with those of the first embodiment are denoted by the same reference numerals, and their description will not be repeated.

Figure 2:
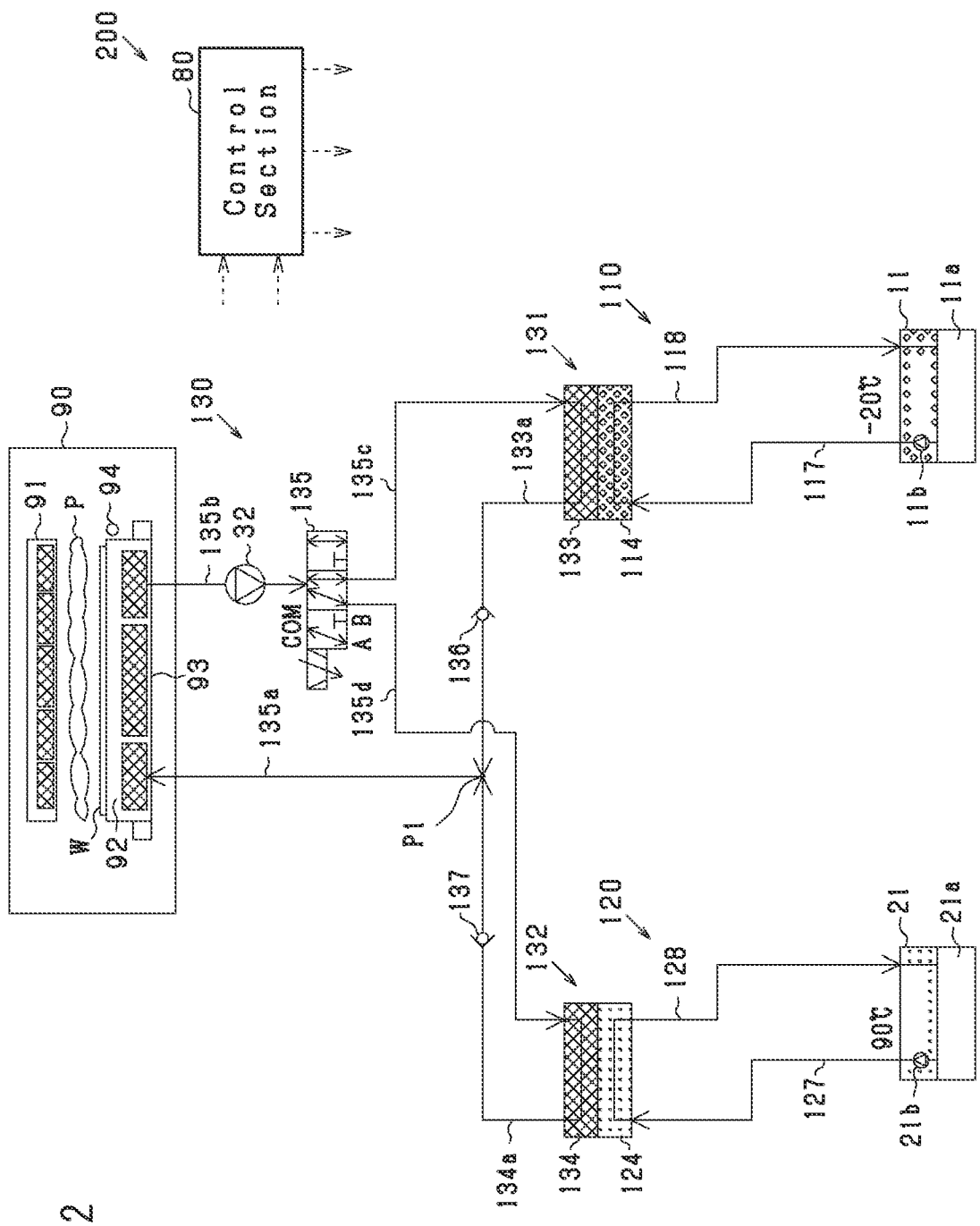
FIG. 2 is a schematic diagram of a temperature control system according to a second embodiment.

As shown in FIG. 2, a temperature control system 200 includes a first circulation circuit 110, a second circulation circuit 120, a third circulation circuit 130, the control section 80, etc.

The first circulation circuit 110 is a circuit through which the above-described first heat transfer medium circulates. The second circulation circuit 120 is a circuit which is independent of the first circulation circuit 110 and through which the above-described second heat transfer medium circulates. The third circulation circuit 130 is a circuit which is independent of the first circulation circuit 110 and the second circulation circuit 120 and through which the above-described third heat transfer medium circulates.

The first circulation circuit 110 includes the first chiller 11, a first flow-through section 114, etc. The first circulation circuit 110 does not include the above-described flowmeter 13, the above-described first distribution valve 12, and the above-described first heat storage unit 16.

The pump 11b discharge to a flow passage 117 the first heat transfer medium stored in the tank 11a. The flow passage 117 is connected to the first flow-through section 114. The first flow-through section 114 is provided inside a heat exchanger 131, and the first heat transfer medium flows through the first flow-through section 114.

A flow passage 118 is connected to the first flow-through section 114. The flow passage 118 is connected to the tank 11a of the first chiller 11. Notably, the flow passage 117 forms a first supply path, and the flow passage 118 forms a first return path.

The second circulation circuit 120 includes the second chiller 21, a second flow-through section 124, etc. The second circulation circuit 120 does not include the above-described flowmeter 23, the above-described second distribution valve 22, and the above-described second heat storage unit 26.

The pump 21b discharge to a flow passage 127 the second heat transfer medium stored in the tank 21a. The flow passage 127 is connected to the second flow-through section 124. The second flow-through section 124 is provided inside a heat exchanger 132, and the second heat transfer medium flows through the second flow-through section 124.

A flow passage 128 is connected to the second flow-through section 124. The flow passage 128 is connected to the tank 21a of the second chiller 21. Notably, the flow passage 127 forms a second supply path, and the flow passage 128 forms a second return path.

The third circulation circuit 130 includes a third flow-through section 133, a fourth flow-through section 134, a third distribution valve 135, a first check valve 136, a second check valve 137, a pump 32, etc.

The third flow-through section 133 is provided inside the heat exchanger 131, and the third heat transfer medium flows through the third flow-through section 133. The third flow-through section 133 is integrated with the first flow-through section 114 and exchange heat with the first flow-through section 114.

A flow passage 133a is connected to the third flow-through section 133. The first check valve 136 is provided in the flow passage 133a. The first check valve 136 permits the third heat transfer medium to flow from the third flow-through section 133 to a merging point P1 and prohibits the third heat transfer medium from flowing from the merging point P1 to the third flow-through section 133.

A flow passage 134a is connected to the fourth flow-through section 134. The second check valve 137 is provided in the flow passage 134a. The second check valve 137 permits the third heat transfer medium to flow from the fourth flow-through section 134 to the merging point P1 and prohibits the third heat transfer medium from flowing from the merging point P1 to the fourth flow-through section 134.

The flow passage 133a and the flow passage 134a are connected to a flow passage 135a at the merging point P1. The flow passage 135a is connected to the inlet port of the heat exchanger 93. A flow passage 135b is connected to the outlet port of the heat exchanger 93. The pump 32 is provided in the flow passage 135b. The flow passage 135b is connected to the common port of the third distribution valve 135.

The third distribution valve 135 (adjustment section) is a three-way valve having the common port, an A port, and a B port. A flow passage 135c is connected to the B port. A flow passage 135d is connected to the A port. The flow passage 135c is connected to the third flow-through section 133 of the heat exchanger 131. The flow passage 135d is connected to the fourth flow-through section 134 of the heat exchanger 132.

The third distribution valve 135 continuously changes the ratio between the flow rate of the third heat transfer medium flowing from the flow passage 135b to the flow passage 135c and the flow rate of the third heat transfer medium flowing from the flow passage 135b to the flow passage 135d. Namely, the third distribution valve 135 changes the ratio between the third heat transfer medium flowing from the heat exchanger 93 to the third flow-through section 133 and the third heat transfer medium flowing from the heat exchanger 93 to the fourth flow-through section 134. The third distribution valve 135 continuously changes the state of flow between a state in which all (100%) of the third heat transfer medium flows from the flow passage 135b to the flow passage 135c and a state in which all (100%) of the third heat transfer medium flows from the flow passage 135b to the flow passage 135d. In the third distribution valve 135, the pressure loss of the third heat transfer medium is constant irrespective of the ratio at which the third heat transfer medium supplied from the pump 32 is distributed between the third flow-through section 133 of the heat exchanger 131 and the fourth flow-through section 134 of the heat exchanger 132.

Since the load of the pump 32 does not change irrespective of the distribution ratio of the third distribution valve 135, the pump 32 is driven in a constant drive state. As a result, the pump 32 circulates the third heat transfer medium through the third circulation circuit 130. The third circulation circuit 130 does not include a tank for storing the third heat transfer medium. Notably, the flow passages 133a, 134a, and 135a form a third supply path. The flow passages 135b, 135c, and 135d form a third return path.

The control section 80 controls the temperature of the lower electrode 92 to the set temperature. The control section 80 controls the distribution ratio of the third distribution valve 135 on the basis of the set temperature of the lower electrode 92 and the temperature detected by the temperature sensor 94. Thus, the flow rate of the third heat transfer medium flowing through the third flow-through section 133 is adjusted; as a result, the amount of heat exchanged between the first flow-through section 114 and the third flow-through section 133 is adjusted. Also, the flow rate of the third heat transfer medium flowing through the fourth flow-through section 134 is adjusted; as a result, the amount of heat exchanged between the second flow-through section 124 and the fourth flow-through section 134 is adjusted.

The second embodiment of the present invention having been described in detail above has the following advantages. Notably, only the advantages different from those of the first embodiment will be described.

The third circulation circuit 130 includes the third flow-through section 133 through which the third heat transfer medium flows and which exchanges heat with the first flow-through section 114, and the fourth flow-through section 134 through which the third heat transfer medium flows and which exchanges heat with the second flow-through section 124. The thermal energy supplied to the first flow-through section 114 can be supplied to the third flow-through section 133 through heat exchange between the first flow-through section 114 and the third flow-through section 133. Similarly, the thermal energy supplied to the second flow-through section 124 can be supplied to the fourth flow-through section 134 through heat exchange between the second flow-through section 124 and the fourth flow-through section 134.

The third circulation circuit 130 includes the flow passages 133a, 134a, and 135a through which the third heat transfer medium flows from the third flow-through section 133 and the fourth flow-through section 134 to the heat exchanger 93, which exchanges heat with the lower electrode 92, and the flow passages 135b, 135c, and 135d through which the third heat transfer medium flows from the heat exchanger 93 to the third flow-through section 133 and the fourth flow-through section 134. Therefore, thermal energy can be supplied, via the third heat transfer medium, to the heat exchanger 93, which exchanges heat with the lower electrode 92.

The third circulation circuit 130 includes the third distribution valve 135 which changes the ratio between the third heat transfer medium flowing from the heat exchanger 93 to the third flow-through section 133 and the third heat transfer medium flowing from the heat exchanger 93 to the fourth flow-through section 134. Therefore, the ratio between the thermal energy that the third flow-through section 133 receives from the first flow-through section 114 and the thermal energy that the fourth flow-through section 134 receives from the second flow-through section 124 can be changed by the third distribution valve 135. Further, for example, by causing the third heat transfer medium from the heat exchanger 93 to flow only to the fourth flow-through section 134, it is possible to prevent the heat exchange between the first flow-through section 114 and the third flow-through section 133, which heat exchange would otherwise occur when the third heat transfer medium flows through the third flow-through section 133. Notably, in the case where the third heat transfer medium flows through the third flow-through section 133, even when the first heat transfer medium does not flow through the first flow-through section 114, the thermal energy remaining in the first flow-through section 114 may be supplied to the third flow-through section 133. From this viewpoint, the above-described configuration can further enhance responsiveness in controlling the temperature of the lower electrode 92.

In the third distribution valve 135, the pressure loss of the third heat transfer medium is constant irrespective of the ratio between the third heat transfer medium flowing from the heat exchanger 93 to the third flow-through section 133 and the third heat transfer medium flowing from the heat exchanger 93 to the fourth flow-through section 134. Therefore, in the case where the third heat transfer medium is circulated through the third circulation circuit 130 by the pump 32, it is unnecessary to control the drive state of the pump 32, and the pump 32 can be driven in a constant drive state.

Notably, in the third distribution valve 135, the pressure loss of the third heat transfer medium may change in accordance with the ratio between the third heat transfer medium flowing from the heat exchanger 93 to the third flow-through section 133 and the third heat transfer medium flowing from the heat exchanger 93 to the fourth flow-through section 134. In such a case, the drive state of the pump 32 is changed appropriately.

Third Embodiment

A third embodiment will now be described. In the following description, the difference between the third embodiment and the second embodiment will be mainly described. Notably, portions identical with those of the first and second embodiments are denoted by the same reference numerals, and their description will not be repeated.

Figure 3:
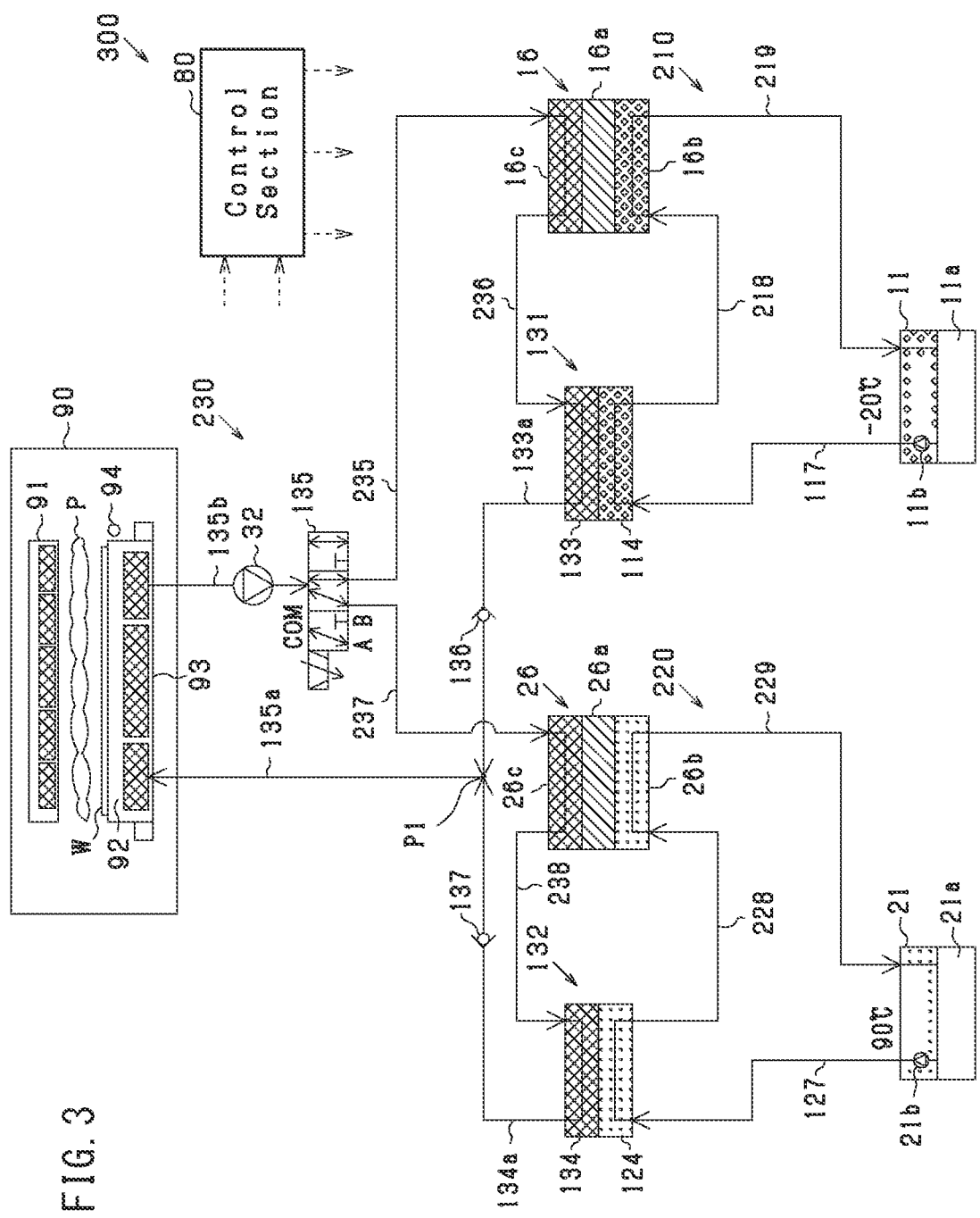
FIG. 3 is a schematic diagram of a temperature control system according to a third embodiment.

As shown in FIG. 3, a temperature control system 300 of the third embodiment of the present invention is obtained by adding the first heat storage unit 16 and the second heat storage unit 26 to the temperature control system 200 of the second embodiment.

A first circulation circuit 210 is a circuit through which the above-described first heat transfer medium circulates. A second circulation circuit 220 is a circuit which is independent of the first circulation circuit 210 and through which the above-described second heat transfer medium circulates. A third circulation circuit 230 is a circuit which is independent of the first circulation circuit 210 and the second circulation circuit 220 and through which the above-described third heat transfer medium circulates.

The first circulation circuit 210 includes the first chiller 11, the first flow-through section 114, the first heat storage flow-through section 16b, etc. The first circulation circuit 210 does not include the above-described first distribution valve 12 and the above-described flowmeter 13.

The first flow-through section 114 and the first heat storage flow-through section 16b are connected to each other by a flow passage 218. The first heat storage flow-through section 16b and the tank 11a of the first chiller 11 are connected to each other by a flow passage 219. Notably, the flow passages 117 and 218 form a first supply path. The flow passage 219 forms a first return path.

The B port of the third distribution valve 135 and the first heat radiation flow-through section 16c are connected to each other by a flow passage 235. The first heat radiation flow-through section 16c and the third flow-through section 133 are connected to each other by a flow passage 236. The first heat radiation flow-through section 16c is provided inside the first heat storage unit 16, and the third heat transfer medium flows through the first heat radiation flow-through section 16c. Notably, the flow passages 235 and 236 form a first intermediary return path.

When the first heat transfer medium of −20° C. flows through the first heat storage flow-through section 16b, the first heat storage material 16a changes its state to solid at −10° C., thereby storing latent heat as thermal energy. When the third heat transfer medium having a temperature higher than −10° C. flows through the first heat radiation flow-through section 16c, the latent heat (thermal energy) stored in the first heat storage material 16a is used for cooling of the third heat transfer medium.

The second circulation circuit 220 includes the second chiller 21, the second flow-through sections 124, the second heat storage flow-through section 26b, etc. The second circulation circuit 220 does not include the above-described second distribution valve 22 and the above-described flowmeter 23.

The second flow-through section 124 and the second heat storage flow-through section 26b are connected to each other by a flow passage 228. The second heat storage flow-through section 26b and the tank 21a of the second chiller 21 are connected to each other by a flow passage 229. Notably, the flow passages 127 and 228 form a second supply path. The flow passage 229 forms a second return path.

The A port of the third distribution valve 135 and the second heat radiation flow-through section 26c are connected to each other by a flow passage 237. The second heat radiation flow-through section 26c and the fourth flow-through section 134 are connected to each other by a flow passage 238. The second heat radiation flow-through section 26c is provided inside the second heat storage unit 26, and the third heat transfer medium flows through the second heat radiation flow-through section 26c. Notably, the flow passages 237 and 238 form a second intermediary return path. The flow passages 135b, 235, 236, 237, and 238 form a third return path.

When the second heat transfer medium of 90° C. flows through the second heat storage flow-through section 26b, the second heat storage material 26a changes its state to solid at 100° C., thereby storing latent heat as thermal energy. When the third heat transfer medium having a temperature higher than 100° C. flows through the second heat radiation flow-through section 26c, the latent heat (thermal energy) stored in the second heat storage material 26a is used for cooling of the third heat transfer medium.

The third embodiment of the present invention having been described in detail above has the following advantages. Notably, only the advantages different from those of the second embodiment will be described.

The first heat storage unit 16 stores thermal energy when the first heat transfer medium flows therethrough and the first heat storage material 16a changes its state at −10° C. Therefore, thermal energy can be stored in the first heat storage unit 16 for preparation for, for example, changing the temperature of the lower electrode 92. Also, in the second circulation circuit 220, the second chiller 21 adjusts the temperature of the second heat transfer medium to 90° C. higher than −20° C. Thus, the second circulation circuit 220 achieves the same action and effect as those of the first circulation circuit 210, by its configuration similar to that of the first circulation circuit 210.

When the third flow-through section 133 receives thermal energy from the first flow-through section 114, the thermal energy stored in the first heat storage unit 16 can also be used. Similarly, when the fourth flow-through section 134 receives thermal energy from the second flow-through section 124, the thermal energy stored in the second heat storage unit 26 can also be used. Therefore, the thermal energies supplied to the third flow-through section 133 and the fourth flow-through section 134 can be increased, and the temperature of the third heat transfer medium can be changed quickly. Accordingly, responsiveness in controlling the temperature of the lower electrode 92 can be enhanced further.

The third circulation circuit 230 includes the flow passages 235 and 236 through which the third heat transfer medium flows from the heat exchanger 93 to the third flow-through section 133 through the first heat storage unit 16. Therefore, when the third heat transfer medium is caused to flow from the heat exchanger 93 to the third flow-through section 133, thermal energy can be supplied directly to the third heat transfer medium from the first heat storage unit 16. Similarly, when the third heat transfer medium is caused to flow from the heat exchanger 93 to the fourth flow-through section 134, thermal energy can be supplied directly to the third heat transfer medium from the second heat storage unit 26. Accordingly, responsiveness in controlling the temperature of the lower electrode 92 can be enhanced further.

Fourth Embodiment

A fourth embodiment will now be described. In the following description, the difference between the fourth embodiment and the third embodiment will be mainly described. Notably, portions identical with those of the first through third embodiments are denoted by the same reference numerals, and their description will not be repeated.

Figure 4:
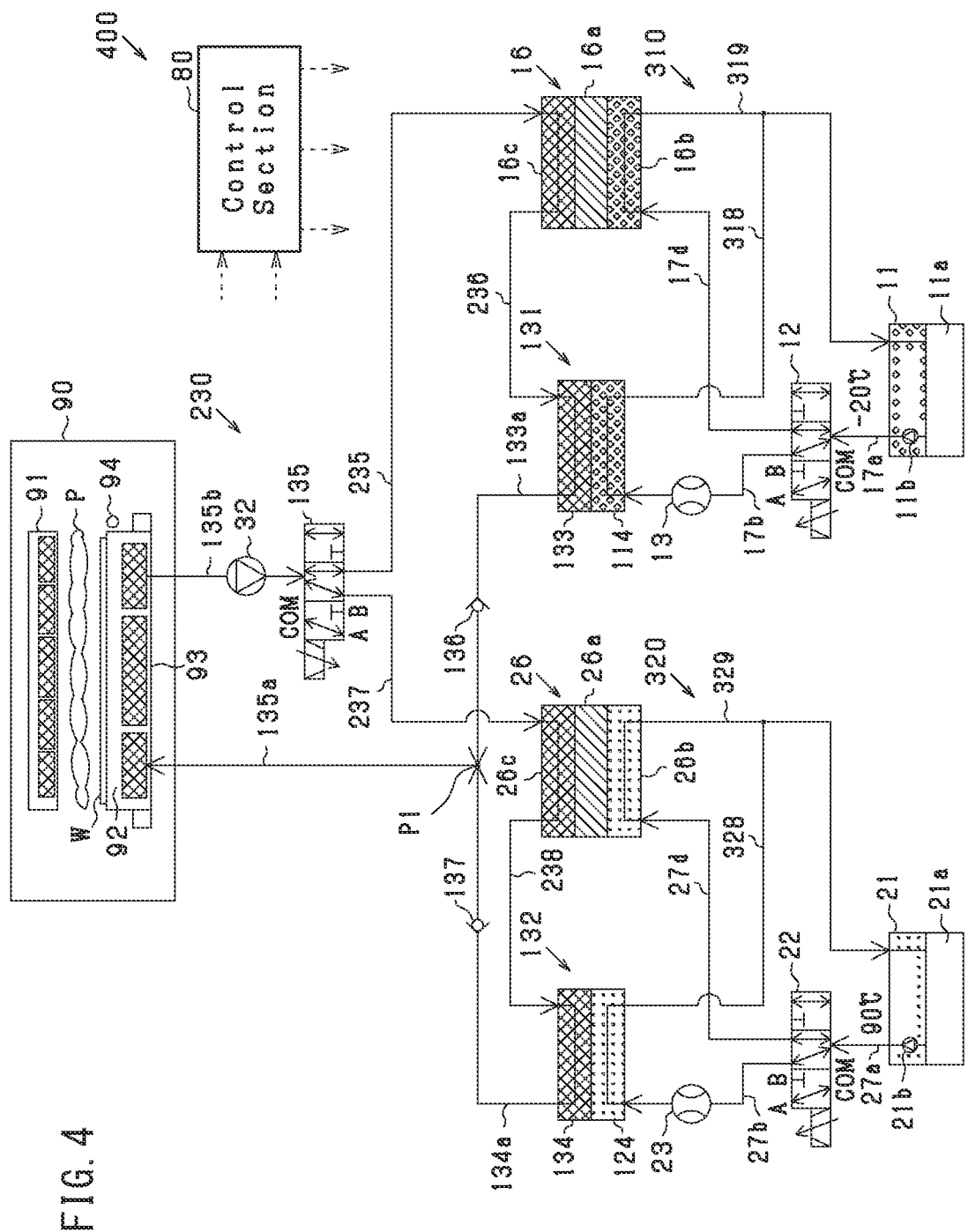
FIG. 4 is a schematic diagram of a temperature control system according to a fourth embodiment.

As shown in FIG. 4, a temperature control system 400 of the fourth embodiment of the present invention is obtained by adding the first distribution valve 12 and the second distribution valve 22 to the temperature control system 300 of the third embodiment.

A first circulation circuit 310 is a circuit through which the above-described first heat transfer medium circulates. A second circulation circuit 320 is a circuit which is independent of the first circulation circuit 310 and through which the above-described second heat transfer medium circulates. The third circulation circuit 230 is a circuit which is independent of the first circulation circuit 310 and the second circulation circuit 320 and through which the above-described third heat transfer medium circulates.

The first heat storage flow-through section 16b and the tank 11a of the first chiller 11 are connected to each other by a flow passage 319. The first flow-through section 114 and the flow passage 319 are connected to each other by a flow passage 318. Notably, the flow passages 17a, 17b, and 17d form a first supply path. The flow passages 318 and 319 form a first return path.

The first distribution valve 12 changes the ratio at which the first heat transfer medium supplied from the first chiller 11 through the flow passage 17a is distributed between the first flow-through section 114 and the first heat storage flow-through section 16b of the first heat storage unit 16.

The second heat storage flow-through section 26b and the tank 21a of the second chiller 21 are connected to each other by a flow passage 329. The second flow-through section 124 and the flow passage 329 are connected to each other by a flow passage 328. Notably, the flow passages 27a, 27b, and 27d form a second supply path. The flow passages 328 and 329 form a second return path.

The second distribution valve 22 changes the ratio at which the second heat transfer medium supplied from the second chiller 21 through the flow passage 27a is distributed between the second flow-through section 124 and the second heat storage flow-through section 26b of the second heat storage unit 26.

In the case where the control section 80 controls the third distribution valve 135 so as to prevent the third heat transfer medium from flowing from the heat exchanger 93 to the third flow-through section 133, the control section 80 controls the first distribution valve 12 such that the first heat transfer medium supplied from the first chiller 11 flows to the first heat storage unit 16. Also, in the case where the control section 80 controls the third distribution valve 135 so as to prevent the third heat transfer medium from flowing from the heat exchanger 93 to the fourth flow-through section 134, the control section 80 controls the second distribution valve 22 such that the second heat transfer medium supplied from the second chiller 21 flows to the second heat storage unit 26.

The fourth embodiment of the present invention having been described in detail above has the following advantages. Notably, only the advantages different from those of the first and third embodiments will be described.

The temperature control system 400 includes the control section 80 for controlling the first distribution valve 12, the second distribution valve 22, and the third distribution valve 135. In the case where the control section 80 controls the third distribution valve 135 as to prevent the flow of the third heat transfer medium from the heat exchanger 93 to the third flow-through section 133, the control section 80 controls the first distribution valve 12 such that the first heat transfer medium supplied from the first chiller 11 flows to the first heat storage unit 16. Therefore, in the case where the third heat transfer medium is not caused to flow from the heat exchanger 93 to the third flow-through section 133; i.e., in the case where heat exchange between the first flow-through section 114 and the third flow-through section 133 is unnecessary, thermal energy can be stored in the first heat storage unit 16. Meanwhile, in the case where the third heat transfer medium is not caused to flow from the heat exchanger 93 to the fourth flow-through section 134; i.e., in the case where heat exchange between the second flow-through section 124 and the fourth flow-through section 134 is unnecessary, thermal energy can be stored in the second heat storage unit 26.

Notably, in the case where the control section 80 controls the third distribution valve 135 such that the third heat transfer medium flows from the heat exchanger 93 to the third flow-through section 133, the control section 80 may control the first distribution valve 12 such that the first heat transfer medium supplied from the first chiller 11 flows to the first heat storage unit 16. Similarly, in the case where the control section 80 controls the third distribution valve 135 such that the third heat transfer medium flows from the heat exchanger 93 to the fourth flow-through section 134, the control section 80 may control the second distribution valve 22 such that the second heat transfer medium supplied from the second chiller 21 flows to the second heat storage unit 26.

Fifth Embodiment

A fifth embodiment will now be described. In the following description, the difference between the fifth embodiment and the fourth embodiment will be mainly described. Notably, portions identical with those of the first through fourth embodiments are denoted by the same reference numerals, and their description will not be repeated.

Figure 5:
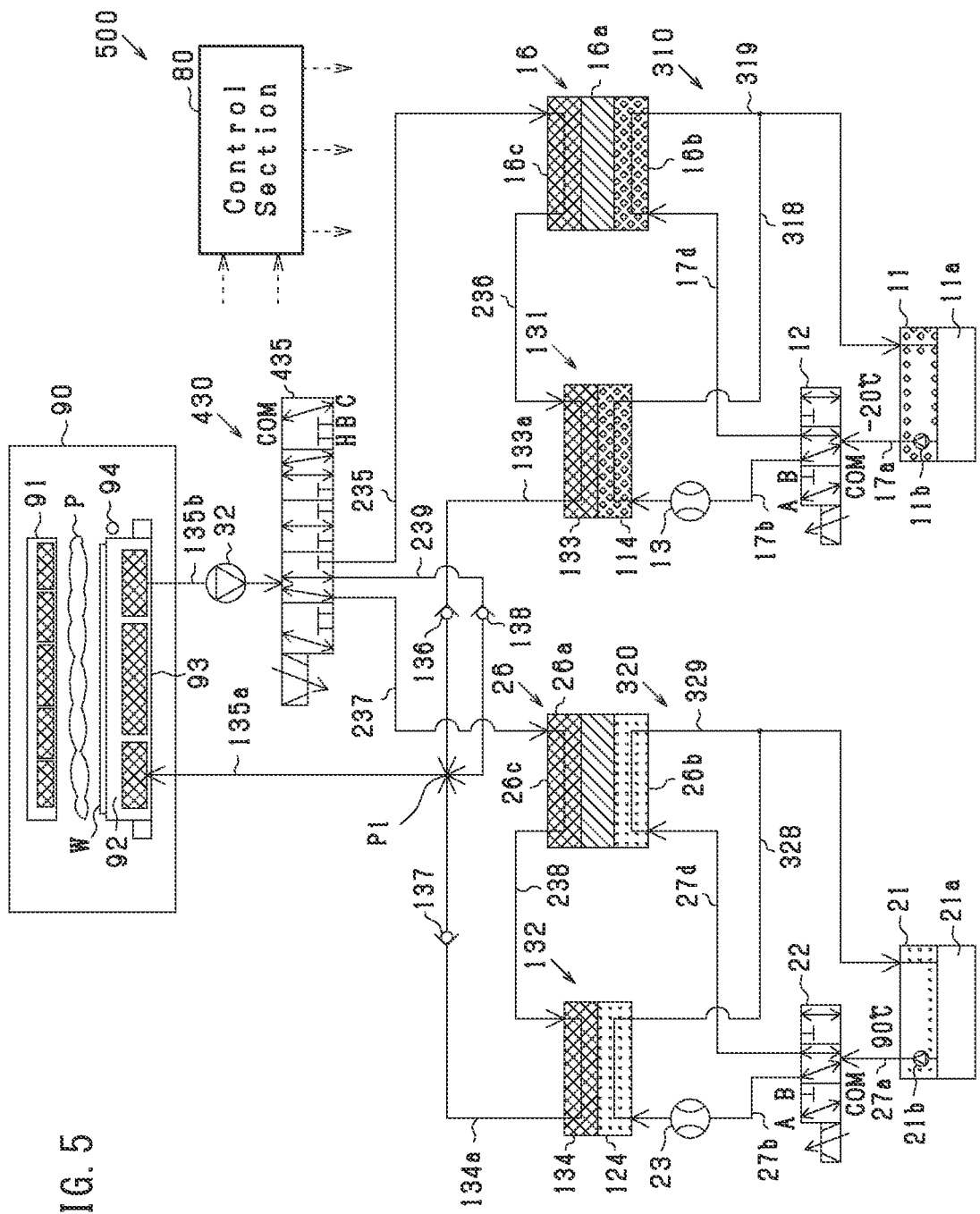
FIG. 5 is a schematic diagram of a temperature control system according to a fifth embodiment.

As shown in FIG. 5, a temperature control system 500 of the fifth embodiment of the present invention is identical with the temperature control system 400 of the fourth embodiment except that the third distribution valve 135 is replaced with a fourth distribution valve 435.

The fourth distribution valve 435 (adjustment section) is a four-way valve having a common port, an H port, a B port, and a C port. The flow passage 235 is connected to the C port. The flow passage 235 is connected to the first heat radiation flow-through section 16c of the first heat storage unit 16. A flow passage 239 is connected to the B port. The flow passage 239 is connected to the flow passage 135a at the merging point P1. A third check valve 138 is provided in the flow passage 239. The third check valve 138 permits the third heat transfer medium to flow from the fourth distribution valve 435 to the merging point P1 and prohibits the third heat transfer medium from flowing from the merging point P1 to the fourth distribution valve 435. The flow passage 237 is connected to the H port. The flow passage 237 is connected to the second heat radiation flow-through section 26c of the second heat storage unit 26.

The fourth distribution valve 435 continuously changes the ratio among the flow rate of the third heat transfer medium flowing from the flow passage 135b to the flow passage 235, the flow rate of the third heat transfer medium flowing from the flow passage 135b to the flow passage 239, and the flow rate of the third heat transfer medium flowing from the flow passage 135b to the flow passage 237. Namely, the fourth distribution valve 435 continuously changes the ratio among the third heat transfer medium flowing from the heat exchanger 93 to the first heat radiation flow-through section 16c and the third flow-through section 133, the third heat transfer medium flowing out of the heat exchanger 93 and returning to the heat exchanger 93 without flowing through the third flow-through section 133 and the fourth flow-through section 134, and the third heat transfer medium flowing from the heat exchanger 93 to the second heat radiation flow-through section 26c and the fourth flow-through section 134. The fourth distribution valve 435 continuously changes the state of flow among a state in which all (100%) of the third heat transfer medium flows from the flow passage 135b to the flow passage 235, a state in which the third heat transfer medium flows from the flow passage 135b to the flow passages 235 and 239, a state in which all (100%) of the third heat transfer medium flows from the flow passage 135b to the flow passage 239, a state in which the third heat transfer medium flows from the flow passage 135b to the flow passages 239 and 237, and a state in which all (100%) of the third heat transfer medium flows from the flow passage 135b to the flow passage 237. In the fourth distribution valve 435, the pressure loss of the third heat transfer medium is constant irrespective of the ratio at which the third heat transfer medium supplied from the pump 32 is distributed among the flow passages 235, 239, and 237.

Since the load of the pump 32 does not change irrespective of the distribution ratio of the fourth distribution valve 435, the pump 32 is driven in a constant drive state. As a result, the pump 32 circulates the third heat transfer medium through the third circulation circuit 430. The third circulation circuit 430 does not include a tank for storing the third heat transfer medium. Notably, the flow passages 133a, 134a, and 135a form a third supply path. The flow passages 135b, 235, 236, 237, and 238 form a third return path.

The control section 80 controls the temperature of the lower electrode 92 to the set temperature. The control section 80 controls the distribution ratio of the fourth distribution valve 435 on the basis of the set temperature of the lower electrode 92 and the results of the detections performed by the flowmeters 13 and 23 and the temperature sensor 94.

The fifth embodiment of the present invention having been described in detail above has the following advantages. Notably, only the advantages different from those of the fourth embodiment will be described.

The ratio among the thermal energy that the third flow-through section 133 receives from the first flow-through section 114, the thermal energy returned to the heat exchanger 93, and the thermal energy that the fourth flow-through section 134 receives from the second flow-through section 124 can be changed by the fourth distribution valve 435. Further, it is possible to realize a state in which the third heat transfer medium flowing out of the heat exchanger 93 is returned as it is to the heat exchanger 93 without allowing the third heat transfer medium to flow from the heat exchanger 93 to the third flow-through section 133 and the fourth flow-through section 134.

Sixth Embodiment

A sixth embodiment will now be described. In the following description, the difference between the sixth embodiment and the fourth embodiment will be mainly described. Notably, portions identical with those of the first through fifth embodiments are denoted by the same reference numerals, and their description will not be repeated.

Figure 6:
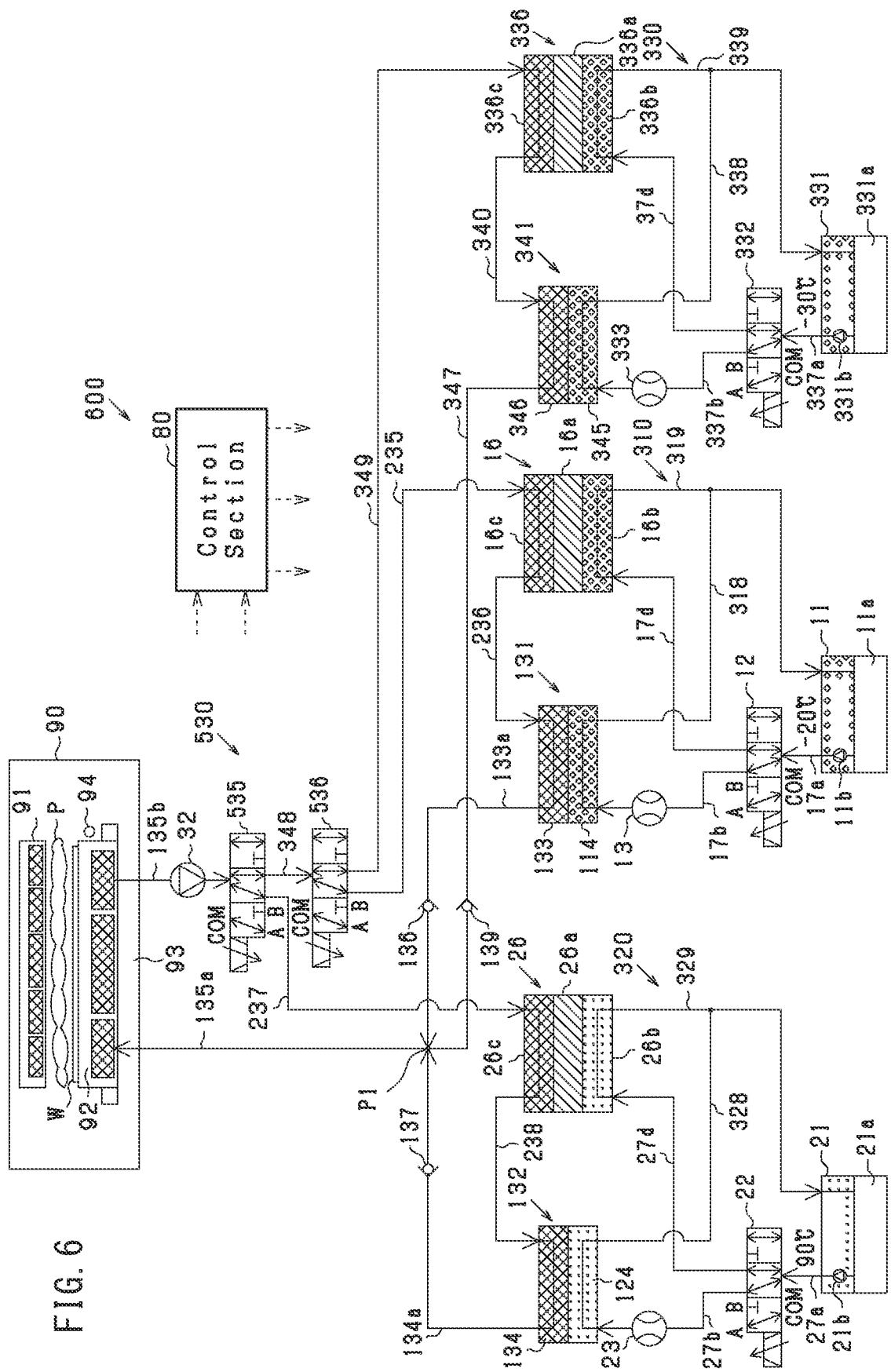
FIG. 6 is a schematic diagram of a temperature control system according to a sixth embodiment.

As shown in FIG. 6, a temperature control system 600 of the sixth embodiment of the present invention is obtained by adding a fourth circulation circuit 330, a sixth flow-through section 346, and a third heat radiation flow-through section 336c to the temperature control system 400 of the fourth embodiment. Further, a third circulation circuit 530 includes a fifth distribution valve 535 and a sixth distribution valve 536 instead of the above-described third distribution valve 135.

The fourth circulation circuit 330 is a circuit which is independent of the first circulation circuit 310, the second circulation circuit 320, and the third circulation circuit 530 and through which a fourth heat transfer medium circulates. The fourth heat transfer medium is the same liquid as the first heat transfer medium and the second heat transfer medium. The third circulation circuit 530 is a circuit which is independent of the first circulation circuit 310, the second circulation circuit 320, and the fourth circulation circuit 330 and through which the above-described third heat transfer medium circulates.

The fourth circulation circuit 330 has the same configuration as the first circulation circuit 310 except for the point that a third chiller 331 (third adjustment apparatus) discharges the fourth heat transfer medium whose temperature has been adjusted to −30° C. (fifth temperature) which is lower than −20° C. (first temperature). The fourth heat transfer medium circulates through the fifth flow-through section 345. Notably, the flow passages 337a, 337b, and 37d form a fourth supply path, and the flow passages 338 and 339 form a fourth return path.

Each of the fifth distribution valve 535 and the sixth distribution valve 536 is a three-way valve identical with the third distribution valve 135. The flow passage 135b is connected to the common port of the fifth distribution valve 535. The B port of the fifth distribution valve 535 and the common port of the sixth distribution valve 536 are connected to each other by a flow passage 348. The A port of the fifth distribution valve 535 and the second heat radiation flow-through section 26c of the second heat storage unit 26 are connected to each other by the flow passage 237. The B port of the sixth distribution valve 536 and the third heat radiation flow-through section 336c of the third heat storage unit 336 are connected to each other by a flow passage 349. The A port of the sixth distribution valve 536 and the first heat radiation flow-through section 16c of the first heat storage unit 16 are connected to each other by the flow passage 235.

The sixth flow-through section 346 is provided inside a heat exchanger 341. In the heat exchanger 341, the fifth flow-through section 345 and the sixth flow-through section 346 exchange heat therebetween. The sixth flow-through section 346 is connected to the merging point P1 by a flow passage 347. A fourth check valve 139 is provided in the flow passage 347. The fourth check valve 139 permits the third heat transfer medium to flow from the sixth flow-through section 346 to the merging point P1 and prohibits the third heat transfer medium from flowing from the merging point P1 to the sixth flow-through section 346.

The fifth distribution valve 535 (adjustment section) changes the ratio between the third heat transfer medium flowing from the heat exchanger 93 to the second heat radiation flow-through section 26c and the fourth flow-through section 134 and the third heat transfer medium flowing from the heat exchanger 93 to the sixth distribution valve 536. The sixth distribution valve 536 (adjustment section) changes the ratio between the third heat transfer medium flowing from the fifth distribution valve 535 to the first heat radiation flow-through section 16c and the third flow-through section 133 and the third heat transfer medium flowing from the fifth distribution valve 535 to the third heat radiation flow-through section 336c and the sixth flow-through section 346. Namely, the fifth distribution valve 535 and the sixth distribution valve 536 change the ratio among the third heat transfer medium flowing from the heat exchanger 93 to the third flow-through section 133, the third heat transfer medium flowing from the heat exchanger 93 to the fourth flow-through section 134, and the third heat transfer medium flowing from the heat exchanger 93 to the sixth flow-through section 346. Notably, the flow passages 133a, 134a, 347, and 135a form a third supply path, and the flow passages 135b, 348, 235, 236, 237, 238, 349, and 340 form a third return path.

For example, in the case where the set temperature is changed from 0° C. to −20° C., the control section 80 controls the fifth distribution valve 535 and the sixth distribution valve 536 so as to temporarily supply all (100%) of the third heat transfer medium to the third heat radiation flow-through section 336c of the third heat storage unit 336 and the sixth flow-through section 346. After that, the control section 80 controls the fifth distribution valve 535 and the sixth distribution valve 536 so as to supply all (100%) of the third heat transfer medium to the first heat radiation flow-through section 16c of the first heat storage unit 16 and the third flow-through section 133.

The sixth embodiment of the present invention having been described in detail above has the following advantages. Notably, only the advantages different from those of the fourth embodiment will be described.

In the fourth circulation circuit 330, the third chiller 331 adjusts the temperature of the fourth heat transfer medium to −30° C. which is lower than −20° C. Thus, the fourth circulation circuit 330 achieves the same action and effect as those of the first circulation circuit 310, by its configuration similar to that of the first circulation circuit 310. The fifth distribution valve 535 and the sixth distribution valve 536 change the ratio among the third heat transfer medium flowing from the heat exchanger 93 to the third flow-through section 133, the third heat transfer medium flowing from the heat exchanger 93 to the fourth flow-through section 134, and the third heat transfer medium flowing from the heat exchanger 93 to the sixth flow-through section 346. Therefore, it is possible to change the ratio among the thermal energy that the third flow-through section 133 receives from the first flow-through section 114, the thermal energy that the fourth flow-through section 134 receives from the second flow-through section 124, and the thermal energy that the sixth flow-through section 346 receives from the fifth flow-through section 345. Accordingly, when the temperature of the lower electrode 92 is lowered to −20° C., the temperature of the lower electrode 92 can be lowered rapidly by temporarily supplying the third heat transfer medium to the sixth flow-through section 346. As a result, responsiveness in controlling the temperature of the lower electrode 92 can be enhanced further.

The ratio among the third heat transfer medium flowing from the heat exchanger 93 to the third flow-through section 133, the third heat transfer medium flowing from the heat exchanger 93 to the fourth flow-through section 134, and the third heat transfer medium flowing from the heat exchanger 93 to the sixth flow-through section 346 can be changed freely by the two distribution valves 535 and 536.

Notably, the above-described configuration may be modified such that the B port of the fifth distribution valve 535 is connected to the third heat radiation flow-through section 336c of the third heat storage unit 336, the A port of the fifth distribution valve 535 is connected to the common port of the sixth distribution valve 536, the B port of the sixth distribution valve 536 is connected to the first heat radiation flow-through section 16c of the first heat storage unit 16, and the A port of the sixth distribution valve 536 is connected to the second heat radiation flow-through section 26c of the second heat storage unit 26.

Also, the temperature control system 600 may include, instead of the fourth circulation circuit 330, a fifth circulation circuit through which a fifth heat transfer medium whose temperature is 100° C. (sixth temperature) which is higher than 90° C. (second temperature) circulates. The fifth heat transfer medium is, for example, the same liquid as the second heat transfer medium. A fifth chiller (fifth adjustment apparatus) of the fifth circulation circuit discharges the fifth heat transfer medium adjusted to 100° C. The fifth circulation circuit includes a seventh flow-through section similar to the second flow-through section 124 and an eighth flow-through section similar to the fourth flow-through section 134. By virtue of such a configuration, when the temperature of the lower electrode 92 is raised to 90° C., the temperature of the lower electrode 92 can be raised rapidly by temporarily supplying the fifth heat transfer medium to the eighth flow-through section. As a result, responsiveness in controlling the temperature of the lower electrode 92 can be enhanced further.

Seventh Embodiment

A seventh embodiment will now be described. In the following description, the difference between the seventh embodiment and the fourth embodiment will be mainly described. Notably, portions identical with those of the first through sixth embodiments are denoted by the same reference numerals, and their description will not be repeated.

Figure 7:
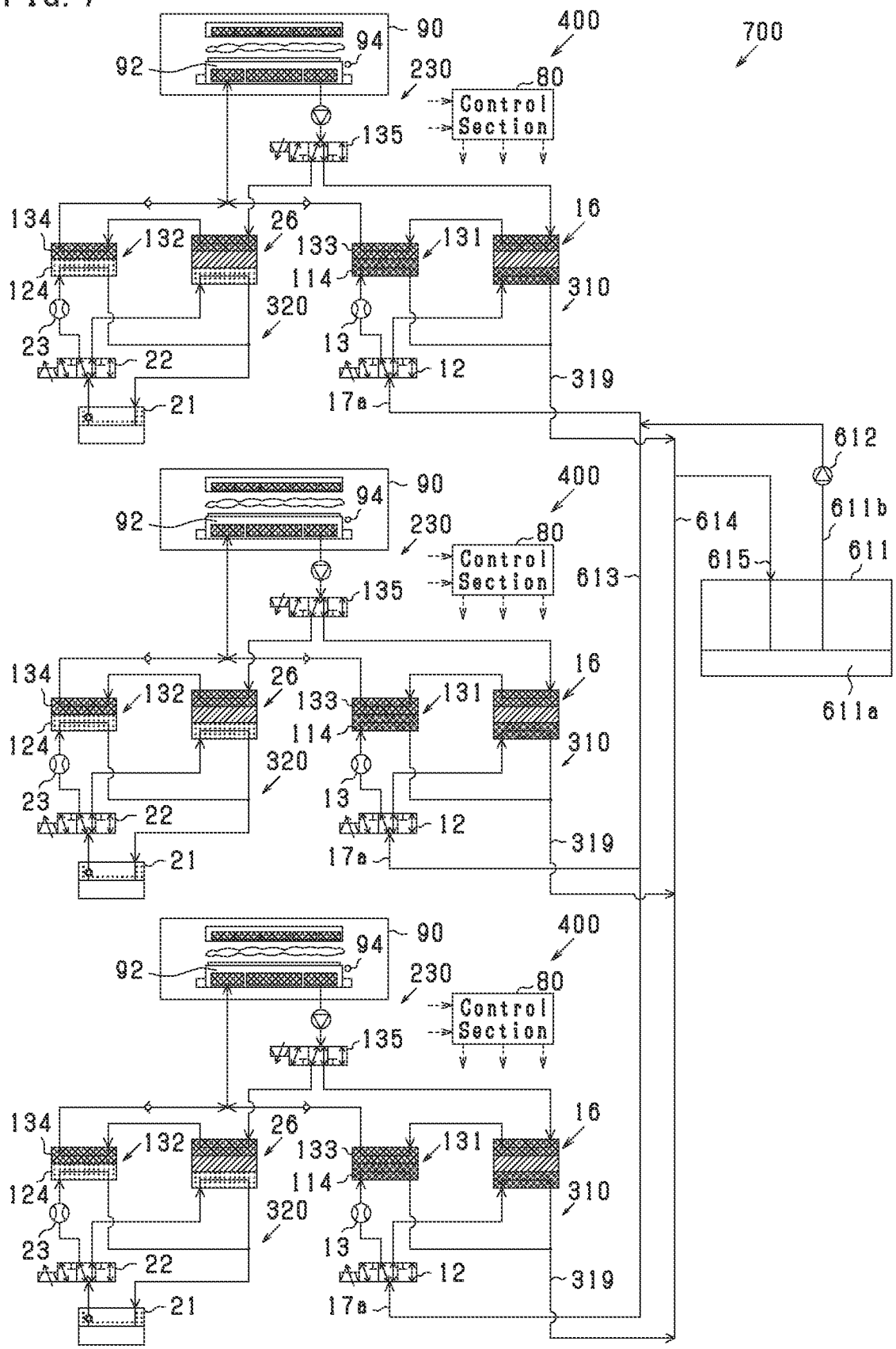
FIG. 7 is a schematic diagram of an integrated temperature control system according to a seventh embodiment.

As shown in FIG. 7, an integrated temperature control system 700 of the seventh embodiment of the present invention includes three (a plurality of) temperature control systems each of which is identical with the temperature control system 400 of the fourth embodiment. However, the integrated temperature control system 700 includes a single refrigerator 611 instead of three first chillers 11.

The refrigerator 611 (first adjustment apparatus) is a large capacity refrigerator whose cooling capacity is 3 to 100 times the cooling capacity of the first chiller 11. The refrigerator 611 includes a tank 611a. The refrigerator 611 adjusts the temperature of the first heat transfer medium to −20° C. (first temperature). The tank 611a stores the first heat transfer medium adjusted to −20° C. A pump 612 discharges the first heat transfer medium stored in the tank 611a to a common flow passage 613 through a flow passage 611b (first supply path).

The common flow passage 613 (first supply path) is branched to three (a plurality of) flow passages each corresponding to the above-described flow passage 17a. Each flow passage 17a is connected to the common port (COM) of the first distribution valve 12 of the corresponding temperature control system 400.

The flow passage 319 of each temperature control system 400 is connected to a common flow passage 614 (first return path). The common flow passage 614 is connected to the tank 611a of the refrigerator 611 by a flow passage 615 (first return path).

The seventh embodiment of the present invention having been described in detail above has the following advantages. Notably, only the advantages different from those of the fourth embodiment will be described.

The three first chillers 11 used in the three temperature control systems 400 so as to adjust the temperature of the first heat transfer medium to −20° C. and discharge the temperature-adjusted first heat transfer medium are integrated into the single refrigerator 611. Therefore, in place of the three first chillers 11, the refrigerator 611 whose cooling capacity is 10 to 100 times the cooling capacity of an ordinary chiller can be employed, whereby the configuration of the integrated temperature control system 700 including the three temperature control systems 400 can be simplified. Notably, the number of the temperature control systems 400 provided in the integrated temperature control system 700 may be several tens to several hundred in some cases. In such a case, the above-described effect becomes remarkable.

Each temperature control system 400 controls the temperature of the lower electrode 92 by adjusting the amount of heat exchanged between the first flow-through section 114 and the third flow-through section 133 and the amount of heat exchanged between the second flow-through section 124 and the fourth flow-through section 134 by using the first distribution valve 12, the second distribution valve 22, and the third distribution valve 135. Therefore, the refrigerator 611 is required only to adjust the temperature of the first heat transfer medium to −20° C. (constant temperature) and discharge the temperature-adjusted first heat transfer medium, and is not required to change the temperature of the first heat transfer medium in accordance with a change in the set temperature of the lower electrode 92. Accordingly, even in the case of a configuration in which a single refrigerator 611 is provided for a plurality of temperature control systems 400, the temperature of the lower electrode 92 of each temperature control system 400 can be controlled.

Notably, in place of three (a plurality of) control sections 80, a single integrated control section may be provided. In such a case, the integrated control section can control the drive state of the refrigerator 611 and the drive state of the pump 612 in accordance with the set temperature of each temperature control system 400 and the results of the detections performed by the temperature sensor 94 and the flowmeters 13 and 23 in each temperature control system 400. Also, free cooling may be performed by bypassing a compressor (not illustrated) within the refrigerator 611.

Eighth Embodiment

An eighth embodiment will now be described. In the following description, the difference between the eight embodiment and the seventh embodiment will be mainly described. Notably, portions identical with those of the first through seventh embodiments are denoted by the same reference numerals, and their description will not be repeated.

Figure 8:
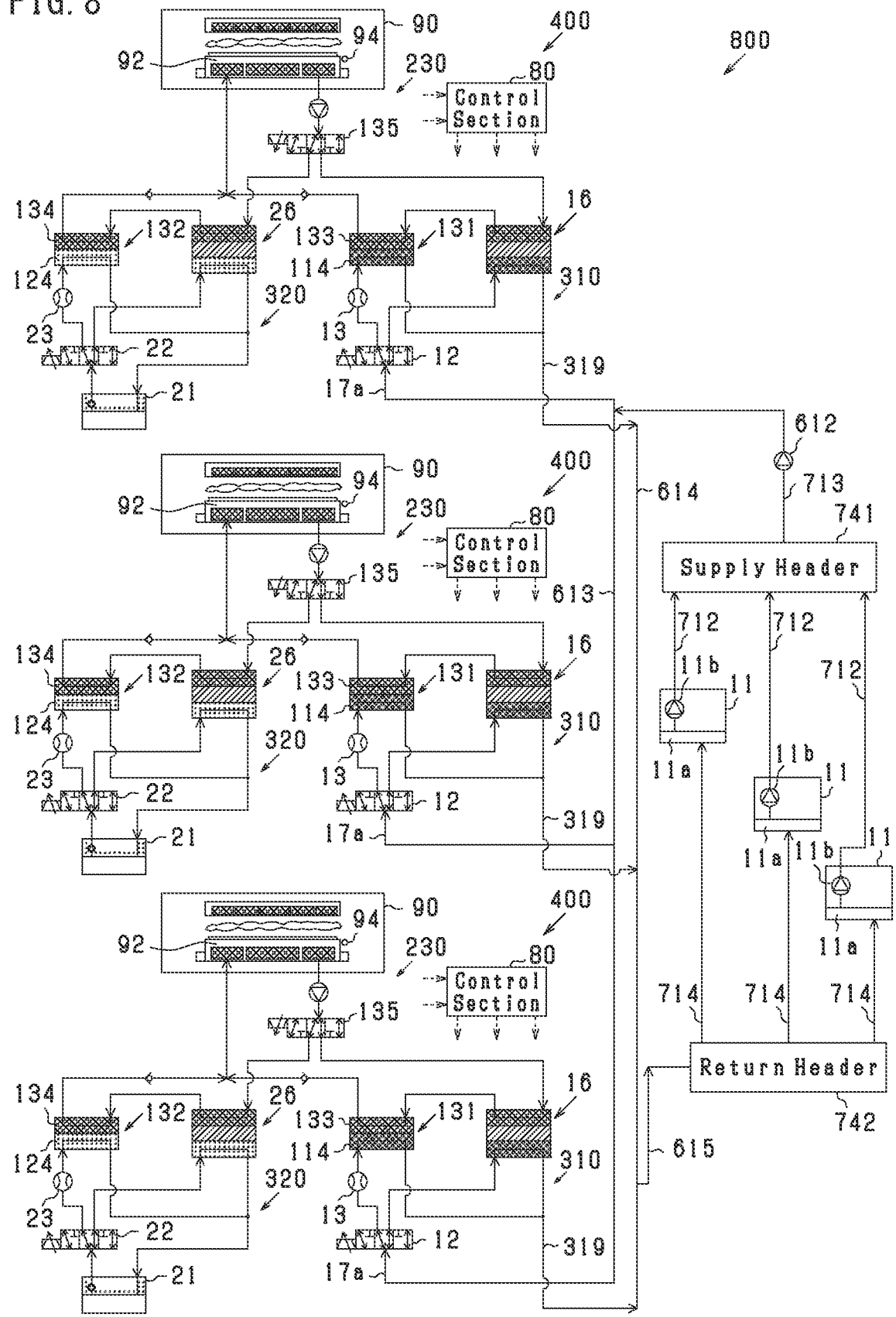
FIG. 8 is a schematic diagram of an integrated temperature control system according to an eighth embodiment.

As shown in FIG. 8, an integrated temperature control system 800 of the eighth embodiment of the present invention includes three (a plurality of) first chillers 11, a supply header 741, a return header 742, etc. instead of the refrigerator 611 of the seventh embodiment.

The pumps 11b of the first chillers 11 are connected to the supply header 741 by flow passages 712 (first supply path). The supply header 741 stores a predetermined amount of the first heat transfer medium. The supply header 741 is connected to the pump 612 by a flow passage 713. The pump 612 discharges the first heat transfer medium stored in the supply header 741 to the common flow passage 613 through the flow passage 713. The common flow passage 613 is branched into three (a plurality of) flow passages corresponding to the above-described flow passages 17a. Each flow passage 17a is connected to the common port (COM) of the first distribution valve 12 of the corresponding temperature control system 400.

The flow passage 319 of each temperature control system 400 is connected to the common flow passage 614 (first return path). The common flow passage 614 is connected to the return header 742 by the flow passage 615 (first return path). The return header 742 stores a predetermined amount of the first heat transfer medium. The return header 742 are connected to the tanks 11a of the first chillers 11 by flow passages 714 (first return path).

The eighth embodiment of the present embodiment having been described in detail above has the following advantages. Notably, only the advantages different from those of the fourth embodiment will be described.

The plurality of first chillers 11 discharge to the common supply header 741 the first heat transfer medium whose temperature has been adjusted to −20° C. The flow passage 712 of each first chiller 11 is connected to the supply header 741. Therefore, the first heat transfer medium of −20° C. discharged from the plurality of first chillers 11 can be stored in the common supply header 741. Even in the case where the capacity of a single first chiller 11 is insufficient to supply the first heat transfer medium of −20° C. (e.g., the case where the temperature of a certain lower electrode 92 is to be lowered rapidly), the first heat transfer medium of −20° C. can be supplied sufficiently from the supply header 741.

The flow passage 615 is connected to the common return header 742, and the plurality of first chillers 11 suck the first heat transfer medium from the return header 742. Therefore, the first heat transfer mediums returned from the flow passages 319 of the plurality of temperature control systems 400 can be mixed in the return header 742. Accordingly, the first heat transfer medium can be returned to each first chiller 11 after the temperature of the first heat transfer medium has been averaged, whereby the cooling loads of the plurality of first chillers 11 are prevented from becoming unbalance.

Notably, the eighth embodiment may be modified as follows. Portions identical with those of the eighth embodiment are denoted by the same reference numerals, and their description will not be repeated.

In place of three (a plurality of) control sections 80, a single integrated control section may be provided. In such a case, the integrated control section sets the number of the first chillers 11 to be operated, in accordance the total of the cooling loads of the plurality of first chillers 11, and operates the plurality of first chillers 11 such that operating time becomes uniform among the plurality of first chillers 11. By virtue of such a configuration, the number of the first chillers 11 to be operated can be set properly, and the operating efficiencies of the first chillers 11 can be improved. Further, the plurality of first chillers 11 are operated such that the operating times of the plurality of first chillers 11 become uniform. Therefore, it is possible to prevent occurrence of a situation in which only the operating time of a particular first chiller 11 becomes long, thereby preventing the life of the particular first chiller 11 from becoming short.

The number of the temperature control systems 400 may differ from the number of the first chillers 11.

Also, the above-described embodiments may be modified as follows. Portions identical with those of the above-described embodiments are denoted by the same reference numerals, and their description will not be repeated.

The first heat transfer medium, the second heat transfer medium, and the fourth heat transfer medium may be different liquids. For example, the first heat transfer medium, the second heat transfer medium, and the fourth heat transfer medium may differ from each other in the ratio between ethylene glycol and water. Also, the first heat transfer medium, the second heat transfer medium, and the fourth heat transfer medium may be formed of different substances. However, it is desired that the first heat transfer medium, the second heat transfer medium, and the fourth heat transfer medium are cheaper than the third heat transfer medium.

The tank 11a of the first chiller 11 and the tank 21a of the second chiller 21 may be omitted.

The second heat storage material 26a of the second heat storage unit 26 may change its state between solid and liquid at 80° C. (fourth temperature) lower than 90° C. (second temperature). In such a case, the control section 80 controls the second distribution valve 22 such that the second heat transfer medium of 90° C. supplied from the second chiller 21 flows to the second heat storage unit 26. As a result, the second heat storage material 26a changes its state to liquid at 80° C., whereby latent heat (thermal energy) can be stored in the second heat storage unit 26. In the case where the second heat transfer medium (third heat transfer medium) whose temperature is lower than 80° C. flows through the second heat radiation flow-through section 26c, the thermal energy stored in the second heat storage material 26a can be used for heating of the second heat transfer medium (third heat transfer medium).

The control target is not limited to the lower electrode 92 and may be the upper electrode 91 of the semiconductor manufacturing apparatus 90. Also, the above-described temperature control systems can be applied not only to the semiconductor manufacturing apparatus 90 but also to other manufacturing apparatuses, processing apparatuses, etc.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A temperature control system for controlling a temperature of a control target, the system comprising:
a first circulation circuit through which a first heat transfer medium circulates;
a second circulation circuit that is independent of the first circulation circuit and through which a second heat transfer medium circulates; and
a third circulation circuit that is independent of the first circulation circuit and the second circulation circuit and through which a third heat transfer medium circulates, the third heat transfer medium having a usable temperature range wider than usable temperature ranges of the first heat transfer medium and the second heat transfer medium, wherein the first circulation circuit comprises:
- a first adjustment apparatus that adjusts a temperature of the first heat transfer medium to a first temperature and discharges the temperature-adjusted first heat transfer medium;
- a first flow-through path through which the first heat transfer medium flows;
- a first supply path through which the first heat transfer medium supplied from the first adjustment apparatus flows to the first flow-through path; and
- a first return path through which the first heat transfer medium, having flowed through the first flow-through path, flows to the first adjustment apparatus, wherein the second circulation circuit comprises:
- a second adjustment apparatus that adjusts a temperature of the second heat transfer medium to a second temperature higher than the first temperature and discharges the temperature-adjusted second heat transfer medium;
- a second flow-through path through which the second heat transfer medium flows;
- a second supply path through which the second heat transfer medium supplied from the second adjustment apparatus flows to the second flow-through path; and
- a second return path through which the second heat transfer medium, having flowed through the second flow-through path, flows to the second adjustment apparatus, wherein the third circulation circuit comprises:
- a third flow-through path through which the third heat transfer medium flows and that exchanges heat with the first flow-through path;
- a fourth flow-through path through which the third heat transfer medium flows and that exchanges heat with the second flow-through path;
- a third supply path through which the third heat transfer medium flows from the third flow-through path and the fourth flow-through path to a heat exchanger that exchanges heat with the control target; and
- a third return path through which the third heat transfer medium flows from the heat exchanger to the third flow-through path and the fourth flow-through path, wherein the third circulation circuit does not comprise a tank that stores the third heat transfer medium, wherein the temperature control system further comprises:
- an adjustment section that adjusts:
  - an amount of the heat exchanged between the first flow-through path and the third flow-through path, and
  - an amount of the heat exchanged between the second flow-through path and the fourth flow-through path, wherein the first circulation circuit further comprises:
- a first heat storage through which the first heat transfer medium flows and that stores thermal energy as a result of a state change of a first heat storage material at a third temperature, wherein the first heat transfer medium supplied from the first adjustment apparatus flows to the first flow-through path and the first heat storage through the first supply path, wherein the first heat transfer medium, having flowed through the first flow-through path and the first heat storage, flows to the first adjustment apparatus through the first return path, wherein the second circulation circuit further comprises:
- a second heat storage through which the second heat transfer medium flows and that stores thermal energy as a result of a state change of a second heat storage material at a fourth temperature higher than the third temperature, wherein the second heat transfer medium supplied from the second adjustment apparatus flows to the second flow-through path and the second heat storage through the second supply path, and wherein the second heat transfer medium, having flowed through the second flow-through path and the second heat storage, flows to the second adjustment apparatus through the second return path.

2. A temperature control system according to claim 1,
wherein the first adjustment apparatus comprises:
- a first tank that stores the first heat transfer medium whose temperature has been adjusted to the first temperature, and wherein the second adjustment apparatus comprises:
- a second tank that stores the second heat transfer medium whose temperature has been adjusted to the second temperature.

3. A temperature control system according to claim 1,
wherein the adjustment section comprises:
- a first distribution valve that is disposed in the first supply path and changes a ratio at which the first heat transfer medium supplied from the first adjustment apparatus is distributed between the first flow-through path and the first heat storage; and
- a second distribution valve that is disposed in the second supply path and changes a ratio at which the second heat transfer medium supplied from the second adjustment apparatus is distributed between the second flow-through path and the second heat storage.

4. A temperature control system according to claim 3, further comprising:
- a controller that controls the first distribution valve and the second distribution valve, wherein when the controller controls the first distribution valve to allow the first heat transfer medium supplied from the first adjustment apparatus to flow to the first flow-through path, the controller controls the second distribution valve to allow the second heat transfer medium supplied from the second adjustment apparatus to flow to the second heat storage, and wherein when the controller controls the second distribution valve to allow the second heat transfer medium supplied from the second adjustment apparatus to flow to the second flow-through path, the controller controls the first distribution valve to allow the first heat transfer medium supplied from the first adjustment apparatus to flow to the first heat storage.

5. A temperature control system according to claim 3,
wherein the first heat storage comprises:
- a first heat radiation flow-through path through which the first heat transfer medium having flowed through the first flow-through section flows; and
- a first heat storage flow-through path that is independent of the first heat radiation flow-through path and through which the first heat transfer medium having not flowed through the first flow-through section flows, and the second heat storage comprises:
- a second heat radiation flow-through path through which the second heat transfer medium having flowed through the second flow-through section flows; and
- a second heat storage flow-through path that is independent of the second heat radiation flow-through path and through which the second heat transfer medium having not flowed through the second flow-through section flows.

6. A temperature control system according to claim 3, wherein in the first distribution valve, the first heat transfer medium produces a constant pressure loss irrespective of the ratio at which the first heat transfer medium is distributed between the first flow-through path and the first heat storage, and
wherein in the second distribution valve, the second heat transfer medium produces a constant pressure loss irrespective of the ratio at which the second heat transfer medium is distributed between the second flow-through path and the second heat storage.

7. A temperature control system according to claim 3, wherein the adjustment section further comprises:
- a third distribution valve that is disposed in the third return path and changes a ratio between the third heat transfer medium flowing from the heat exchanger to the third flow-through path and the third heat transfer medium flowing from the heat exchanger to the fourth flow-through path,
wherein the temperature control system further comprises:
- a controller that controls the first distribution valve, the second distribution valve, and the third distribution valve,
wherein when the controller controls the third distribution valve to prevent the third heat transfer medium from flowing from the heat exchanger to the third flow-through path, the controller controls the first distribution valve to allow the first heat transfer medium supplied from the first adjustment apparatus to flow to the first heat storage and,
wherein when the controller controls the third distribution valve to prevent the third heat transfer medium from flowing from the heat exchanger to the fourth flow-through path, the controller controls the second distribution valve to allow the second heat transfer medium supplied from the second adjustment apparatus to flow to the second heat storage.

8. A temperature control system according to claim 7, wherein the third return path comprises:
- a first intermediary return path through which the third heat transfer medium flows from the heat exchanger to the third flow-through path through the first heat storage; and
- a second intermediary return path through which the third heat transfer medium flows from the heat exchanger to the fourth flow-through path through the second heat storage.

9. A temperature control system according to claim 1, wherein the adjustment section comprises:
- a third distribution valve that is disposed in the third return path and changes a ratio between the third heat transfer medium flowing from the heat exchanger to the third flow-through path and the third heat transfer medium flowing from the heat exchanger to the fourth flow-through path.

10. A temperature control system according to claim 9, wherein in the third distribution valve, the third heat transfer medium produces a constant pressure loss irrespective of the ratio between the third heat transfer medium flowing from the heat exchanger to the third flow-through path and the third heat transfer medium flowing from the heat exchanger to the fourth flow-through path.

11. A temperature control system according to claim 1, wherein the adjustment section comprises:
- a fourth distribution valve that is disposed in the third return path and changes the ratio among:
  - the third heat transfer medium flowing from the heat exchanger to the third flow-through path,
  - the third heat transfer medium flowing out of the heat exchanger and returning to the heat exchanger without flowing through the third flow-through path and the fourth flow-through path, and
  - the third heat transfer medium flowing from the heat exchanger to the fourth flow-through path.

12. A temperature control system according to claim 1, further comprising:
- a fourth circulation circuit that is independent of the first circulation circuit, the second circulation circuit, and the third circulation circuit and through which a fourth heat transfer medium flows,
wherein the usable temperature range of the third heat transfer medium is wider than a usable temperature range of the fourth heat transfer medium,
wherein the fourth circulation circuit comprises:
- a third adjustment apparatus that adjusts a temperature of the fourth heat transfer medium to a fifth temperature lower than the first temperature and discharges the temperature-adjusted fourth heat transfer medium;
- a fifth flow-through path through which the fourth heat transfer medium flows;
- a fourth supply path through which the fourth heat transfer medium supplied from the third adjustment apparatus flows to the fifth flow-through path; and
- a fourth return path through which the fourth heat transfer medium, having flowed through the fifth flow-through path, flows to the third adjustment apparatus,
wherein the third circulation circuit comprises:
- a sixth flow-through path through which the third heat transfer medium flows and that changes heat with the fifth flow-through path,
wherein the third heat transfer medium flows from the third flow-through path, the fourth flow-through path, and the sixth flow-through path to the heat exchanger through the third supply path,
wherein the third heat transfer medium flows from the heat exchanger to the third flow-through path, the fourth flow-through path, and the sixth flow-through path through the third return path, and
wherein the adjustment section is disposed in the third return path and controls the ratio among:
- the third heat transfer medium flowing from the heat exchanger to the third flow-through path,
- the third heat transfer medium flowing from the heat exchanger to the fourth flow-through path, and
- and the third heat transfer medium flowing from the heat exchanger to the sixth flow-through path.

13. A temperature control system according to claim 12, wherein the adjustment section comprises a fifth distribution valve and a sixth distribution valve that are disposed in the third return path, wherein the fifth distribution valve changes the ratio between the third heat transfer medium flowing from the heat exchanger to the fourth flow-through path and the third heat transfer medium flowing from the heat exchanger to the sixth distribution valve, and
wherein the sixth distribution valve changes the ratio between the third heat transfer medium flowing from the fifth distribution valve to the third flow-through path and the third heat transfer medium flowing from the fifth distribution valve to the sixth flow-through path.

14. An integrated temperature control system comprising:
a plurality of temperature control systems each of which controls a temperature of a control target and comprises:
  a first circulation circuit through which a first heat transfer medium circulates;
  a second circulation circuit that is independent of the first circulation circuit and through which a second heat transfer medium circulates; and
  a third circulation circuit that is independent of the first circulation circuit and the second circulation circuit and through which a third heat transfer medium circulates, the third heat transfer medium having a usable temperature range wider than usable temperature ranges of the first heat transfer medium and the second heat transfer medium,
wherein the first circulation circuit comprises:
  a first adjustment apparatus that adjusts a temperature of the first heat transfer medium to a first temperature and discharges the temperature-adjusted first heat transfer medium;
  a first flow-through path through which the first heat transfer medium flows;
  a first supply path through which the first heat transfer medium supplied from the first adjustment apparatus flows to the first flow-through path; and
  a first return path through which the first heat transfer medium, having flowed through the first flow-through path, flows to the first adjustment apparatus,
wherein the second circulation circuit comprises:
  a second adjustment apparatus that adjusts a temperature of the second heat transfer medium to a second temperature higher than the first temperature and discharges the temperature-adjusted second heat transfer medium;
  a second flow-through path through which the second heat transfer medium flows;
  a second supply path through which the second heat transfer medium supplied from the second adjustment apparatus flows to the second flow-through path; and
  a second return path through which the second heat transfer medium, having flowed through the second flow-through path, flows to the second adjustment apparatus,
wherein the third circulation circuit comprises:
  a third flow-through path through which the third heat transfer medium flows and that exchanges heat with the first flow-through path;
  a fourth flow-through path through which the third heat transfer medium flows and that exchanges heat with the second flow-through path;
  a third supply path through which the third heat transfer medium flows from the third flow-through path and the fourth flow-through path to a heat exchanger that exchanges heat with the control target; and
  a third return path through which the third heat transfer medium flows from the heat exchanger to the third flow-through path and the fourth flow-through path,
wherein the third circulation circuit does not comprise a tank that stores the third heat transfer medium,
wherein each of the temperature control systems further comprises:
  an adjustment section that adjusts:
    an amount of the heat exchanged between the first flow-through path and the third flow-through path, and
    an amount of the heat exchanged between the second flow-through path and the fourth flow-through path,
wherein the first adjustment apparatus is shared by the temperature control systems,
wherein the first circulation circuit further comprises:
  a first heat storage through which the first heat transfer medium flows and that stores thermal energy as a result of a state change of a first heat storage material at a third temperature,
wherein the first heat transfer medium supplied from the first adjustment apparatus flows to the first flow-through path and the first heat storage through the first supply path,
wherein the first heat transfer medium, having flowed through the first flow-through path and the first heat storage, flows to the first adjustment apparatus through the first return path,
wherein the second circulation circuit further comprises:
  a second heat storage through which the second heat transfer medium flows and that stores thermal energy as a result of a state change of a second heat storage material at a fourth temperature higher than the third temperature,
wherein the second heat transfer medium supplied from the second adjustment apparatus flows to the second flow-through path and the second heat storage through the second supply path, and
wherein the second heat transfer medium, having flowed through the second flow-through path and the second heat storage, flows to the second adjustment apparatus through the second return path.

15. An integrated temperature control system comprising:
a plurality of temperature control systems each of which controls a temperature of a control target and comprises:
  a first circulation circuit through which a first heat transfer medium circulates;
  a second circulation circuit that is independent of the first circulation circuit and through which a second heat transfer medium circulates; and
  a third circulation circuit that is independent of the first circulation circuit and the second circulation circuit and through which a third heat transfer medium circulates, the third heat transfer medium having a usable temperature range wider than usable temperature ranges of the first heat transfer medium and the second heat transfer medium,
wherein the first circulation circuit comprises:
  a first adjustment apparatus that adjusts a temperature of the first heat transfer medium to a first temperature and discharges the temperature-adjusted first heat transfer medium;
  a first flow-through path through which the first heat transfer medium flows;

a first supply path through which the first heat transfer medium supplied from the first adjustment apparatus flows to the first flow-through path; and a first return path through which the first heat transfer medium, having flowed through the first flow-through path, flows to the first adjustment apparatus, wherein the second circulation circuit comprises:

a second adjustment apparatus that adjusts a temperature of the second heat transfer medium to a second temperature higher than the first temperature and discharges the temperature-adjusted second heat transfer medium;

a second flow-through path through which the second heat transfer medium flows;

a second supply path through which the second heat transfer medium supplied from the second adjustment apparatus flows to the second flow-through path; and a second return path through which the second heat transfer medium, having flowed through the second flow-through path, flows to the second adjustment apparatus, wherein the third circulation circuit further comprises:

a third flow-through path through which the third heat transfer medium flows and that exchanges heat with the first flow-through path;

a fourth flow-through path through which the third heat transfer medium flows and that exchanges heat with the second flow-through path;

a third supply path through which the third heat transfer medium flows from the third flow-through path and the fourth flow-through path to a heat exchanger that exchanges heat with the control target; and a third return path through which the third heat transfer medium flows from the heat exchanger to the third flow-through path and the fourth flow-through path, wherein the third circulation circuit does not comprise a tank that stores the third heat transfer medium, wherein each of the temperature control systems further comprises:

an adjustment section that adjusts:

an amount of the heat exchanged between the first flow-through path and the third flow-through path, and an amount of the heat exchanged between the second flow-through path and the fourth flow-through path; and a plurality of the first adjustment apparatuses that discharge the first heat transfer medium to a common supply header, the temperature of the first heat transfer medium having been adjusted to the first temperature, and suck the first heat transfer medium from a common return header, wherein the first supply paths of the temperature control systems are connected to the common supply header, and wherein the first return paths of the temperature control systems are connected to the common return header.

16. An integrated temperature control system according to claim 15, wherein a number of the first adjustment apparatuses to be operated is set depending on a total of cooling loads of the first adjustment apparatuses, and wherein the first adjustment apparatuses are operated to make operating times of the first adjustment apparatuses become uniform.

* * * * *